(12) United States Patent
Horikawa et al.

(10) Patent No.: US 9,865,591 B2
(45) Date of Patent: Jan. 9, 2018

(54) SILICON CARBIDE SEMICONDUCTOR DEVICE

(71) Applicant: Panasonic Intellectual Property Management Co., Ltd., Osaka (JP)

(72) Inventors: Nobuyuki Horikawa, Kyoto (JP); Osamu Kusumoto, Nara (JP); Masashi Hayashi, Osaka (JP); Masao Uchida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/342,023

(22) Filed: Nov. 2, 2016

(65) Prior Publication Data

US 2017/0077087 A1  Mar. 16, 2017

Related U.S. Application Data

(63) Continuation of application No. PCT/JP2015/002551, filed on May 21, 2015.

(30) Foreign Application Priority Data

May 23, 2014  (JP) .................................. 2014-107107

(51) Int. Cl.
*H01L 29/15* (2006.01)
*H01L 27/06* (2006.01)
(Continued)

(52) U.S. Cl.
CPC .......... *H01L 27/0605* (2013.01); *H01L 27/04* (2013.01); *H01L 29/06* (2013.01);
(Continued)

(58) Field of Classification Search
CPC . H01L 27/0605; H01L 29/41; H01L 29/0623; H01L 29/1608; H01L 29/78;
(Continued)

(56) References Cited

U.S. PATENT DOCUMENTS 8,563,988 B2 * 10/2013 Uchida ............... H01L 29/7828
257/77
2006/0131645 A1   6/2006 Kaneko
(Continued)

FOREIGN PATENT DOCUMENTS

JP    2006-140372    6/2006
JP    2014-082521    5/2014
(Continued)

OTHER PUBLICATIONS

International Search Report of PCT application No. PCT/JP2015/002551 dated Jun. 23, 2015.

*Primary Examiner* — Vu A Vu
(74) *Attorney, Agent, or Firm* — McDermott Will & Emery LLP

(57) ABSTRACT

A silicon carbide semiconductor device includes a transistor region, a diode region, a gate line region, and a gate pad region. The gate pad region and the gate line region are each disposed to be sandwiched between the diode region and the diode region, and a gate electrode on the gate pad region and the gate line region is formed on an insulating film formed on an epitaxial layer. Thus, breakdown of the insulating film in the gate region can be prevented without causing deterioration in quality of the gate insulating film, upon switching and avalanche breakdown.

8 Claims, 19 Drawing Sheets

(51) Int. Cl.

| | |
|---|---|
| *H01L 29/78* | (2006.01) |
| *H01L 27/04* | (2006.01) |
| *H01L 29/861* | (2006.01) |
| *H01L 29/868* | (2006.01) |
| *H01L 29/06* | (2006.01) |
| *H01L 29/12* | (2006.01) |
| *H01L 29/16* | (2006.01) |
| *H01L 29/41* | (2006.01) |

(52) U.S. Cl.
CPC .......... *H01L 29/0623* (2013.01); *H01L 29/12* (2013.01); *H01L 29/1608* (2013.01); *H01L 29/41* (2013.01); *H01L 29/78* (2013.01); *H01L 29/861* (2013.01); *H01L 29/868* (2013.01)

(58) Field of Classification Search
CPC ..... H01L 27/04; H01L 29/861; H01L 29/868; H01L 29/12; H01L 29/06
USPC .......................................................... 257/77
See application file for complete search history.

(56) References Cited

U.S. PATENT DOCUMENTS

| | | |
|---|---|---|
| 2011/0210392 A1 | 9/2011 | Nakata et al. |
| 2013/0020587 A1 | 1/2013 | Hino et al. |

FOREIGN PATENT DOCUMENTS

| | | | | |
|---|---|---|---|---|
| WO | 2010/073759 | | 7/2010 | |
| WO | WO2012/056705 | * | 5/2012 | ............. H01L 21/00 |

* cited by examiner

SILICON CARBIDE SEMICONDUCTOR DEVICE

BACKGROUND

1. Technical Field

The present application relates to a silicon carbide semiconductor device.

2. Description of the Related Art

Silicon carbide (SiC) is a semiconductor material having larger bandgap and higher hardness than those of silicon (Si). SiC is applied to a power element such as a switching element or a rectifier element, for example. The power element using SiC has the advantage of being capable of reducing power loss in comparison with a power element using Si.

A metal-oxide-semiconductor field-effect transistor (MOSFET) is a representative semiconductor element using SiC.

The use of SiC-MOSFET for a switching element used for a power converter for the drive control of a load such as a motor has been considered.

For example, structures described in Patent Literatures 1 and 2 are disclosed as a MOSFET using SiC. In the MOSFET disclosed in PTL 1, an upper source electrode which is electrically connected to respective vertical MOSFET cells is formed on a cell region where a gate pad to which a gate voltage is externally applied and the vertical MOSFET cells are disposed in parallel. Further, a gate line is formed along an outer periphery so as to surround the upper source electrode in a state of being electrically connected to the gate pad. The gate line formed to surround the upper source electrode suppresses a time lag in the potential of the gate electrode according to the distance from the gate pad, thereby increasing the speed of switching. For example, when polysilicon which is not so sufficiently high in conductivity is used for the gate electrode, gate resistance of the MOSFET is increased if the gate electrode is located distant from the gate pad. Therefore, the time lag occurs between the potential of the gate pad and the potential of the gate electrode due to the time constant determined by the gate resistance of the MOSFET and the capacitance between the source and the gate in the MOSFET cell having high gate resistance. In view of this, the gate line is formed from a low-resistance material such as aluminum and formed to surround the upper source electrode, whereby the gate resistance of each MOSFET cell is reduced and a potential is easily supplied to the gate electrode, which increases the speed of switching.

Further, a termination structure is formed at the outside of the gate line. The termination structure has a function of relaxing an electric field on the surface. A junction termination extension (hereinafter abbreviated to JTE) structure or mesa structure in addition to a field limiting ring (hereinafter abbreviated to FLR) structure have widely been used for the termination structure.

CITATION LIST

Patent Literature

PTL 1: International Publication No. 2010/073759
PTL 2: Unexamined Japanese Patent Publication No. 2006-140372

The conventional MOSFET described above has been required to have a higher breakdown voltage.

SUMMARY

A certain non-limitative exemplary embodiment of the present application provides a silicon carbide semiconductor device having a high breakdown voltage.

A silicon carbide semiconductor device according to an exemplary embodiment of the present application includes a laminated structure that includes a first conductive type semiconductor substrate, a first conductive type first silicon carbide semiconductor layer located on a main surface of the semiconductor substrate, and a first ohmic electrode located on a back surface of the semiconductor substrate, the laminated structure including a transistor region, a termination region, and a diode region, each region including a part of the semiconductor substrate, a part of the first silicon carbide semiconductor layer, and a part of the first ohmic electrode, as viewed in a direction perpendicular to the main surface of the semiconductor substrate, the termination region surrounds the transistor region and the diode region is located between the termination region and the termination region. The transistor region includes a plurality of unit cell regions. The silicon carbide semiconductor device includes, in each of the unit cell regions: a second conductive type first well region located in a part of the first silicon carbide semiconductor layer; a first conductive type source region located in the first well region; a second silicon carbide semiconductor layer formed on a part of the first silicon carbide semiconductor layer so as to be in contact with at least a part of the first well region and a part of the source region, the second silicon carbide semiconductor layer including a first conductive type layer having a lower impurity concentration than an impurity concentration of at least the first silicon carbide semiconductor layer; a gate insulating film on the second silicon carbide semiconductor layer; a gate electrode located on the gate insulating film; a second ohmic electrode electrically connected to the source region; and an upper electrode electrically connected to the second ohmic electrode. The silicon carbide semiconductor device according to the exemplary embodiment also includes, in the diode region, a second conductive type second well region, a contact region, a second silicon carbide semiconductor layer, an insulating film, a gate electrode, a gate line, a gate pad, a third ohmic electrode, and a source line, and includes, in the termination region, a second conductive type impurity region. The second conductive type second well region is located in a part of the first silicon carbide semiconductor layer. The contact region is located in the second well region and has a higher impurity concentration than an impurity concentration of the second well region. The second silicon carbide semiconductor layer is formed on a part of the first silicon carbide semiconductor layer so as to be in contact with at least a part of the contact region. The insulating film is formed on the second silicon carbide semiconductor layer and has a thickness substantially same as a thickness of the gate insulating film. The gate electrode is formed on at least a part of the insulating film. The gate line is located on the contact region and electrically connected to the gate electrode. The gate pad is located on the contact region and electrically connected to the gate line for establishing external connection. The third ohmic electrode is electrically connected to at least a region located between the gate line and the transistor region and a region located between the gate line and the termination region in the contact region. The source line is electrically connected to the third ohmic electrode and the upper electrode on each of the unit cell regions. The second conductive type impurity region is located in a part of the first silicon carbide semiconductor layer in the termination region.

The silicon carbide semiconductor device according to the present disclosure includes the third ohmic electrode in the region between the gate line and the termination region in the diode region located between the transistor region and the termination region, the third ohmic electrode being electrically connected to the contact region in the second well region in the diode region. With this configuration, a displacement current or an avalanche current can be released through the third ohmic electrode, whereby a potential rise in the second well region can be suppressed, and breakdown of the insulating film below the gate electrode can be prevented.

DETAILED DESCRIPTION

Figure 16:
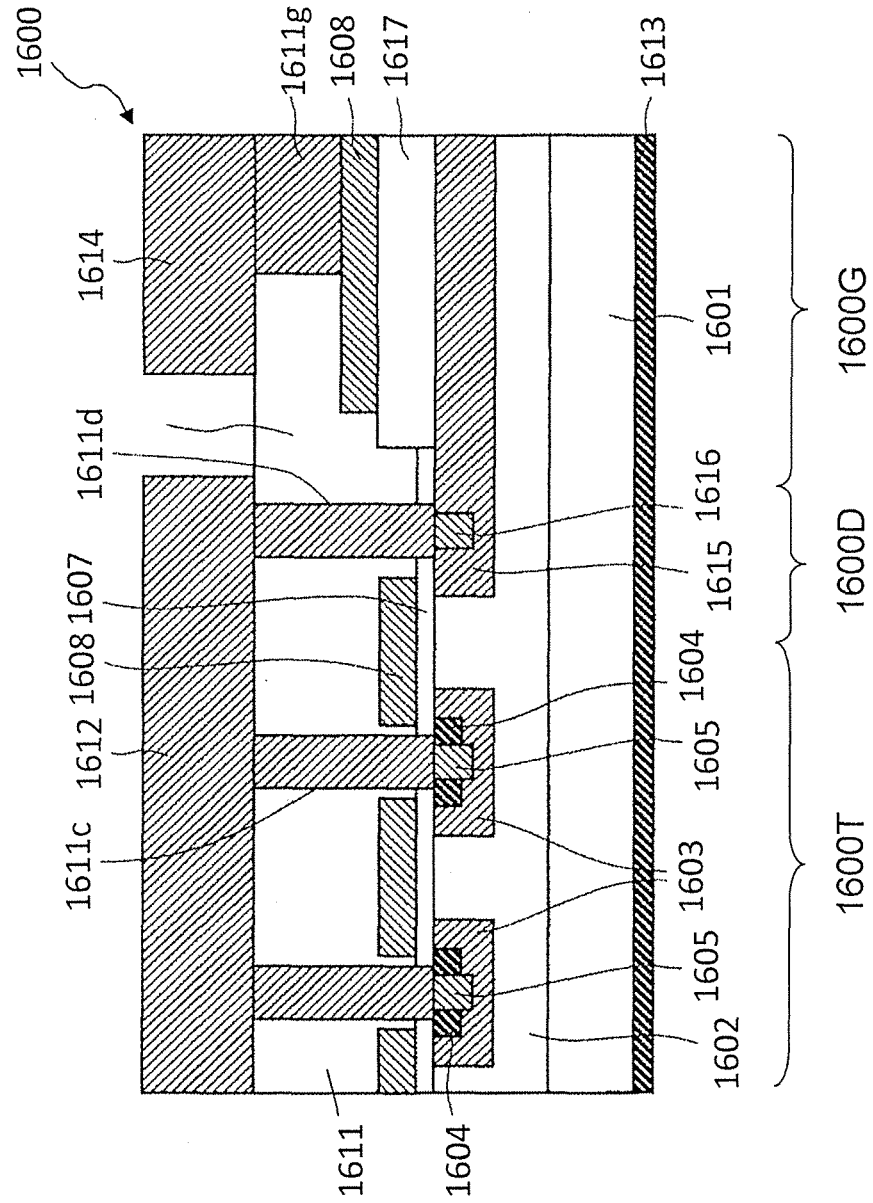
FIG. 16 is a schematic sectional diagram illustrating an SiC-MOSFET disclosed in PTL 1.

The inventors of the present application have studied a breakdown voltage of a semiconductor device according to a conventional art in detail. FIG. 16 illustrates a sectional schematic diagram illustrating silicon carbide metal-oxide-semiconductor field-effect transistor (SiC-MOSFET) 1600 disclosed in PTL 1. SiC-MOSFET 1600 includes diode region 1600D and gate pad region 1600G.

MOSFET cell 1600T includes a first conductive type first silicon carbide semiconductor (drift layer), second conductive type first well region 1603, first conductive type source region 1604, second conductive type contact region 1605, gate insulating film 1607, and gate electrode 1608 formed on the gate insulating film.

The first conductive type first silicon carbide semiconductor (drift layer) is formed on first conductive type semiconductor substrate 1601. Second conductive type first well region 1603 is selectively formed on the surface of first conductive type drift layer 1602. First conductive type source region 1604 is selectively formed in a surface layer of the first well region. Gate insulating film 1607 is formed on the first conductive type drift layer. Gate electrode 1608 is formed on the gate insulating film. When a voltage is applied to gate electrode 1608, carriers are induced on the surface of the first well region, by which a field effect transistor (FET) channel is formed.

Diode region 1600D includes first conductive type drift layer 1602 formed on first conductive type semiconductor substrate 1601, second conductive type second well region 1615 selectively formed on the surface of drift layer 1602, second conductive type second contact region 1616 formed on a surface layer of the second well region, and a second ohmic electrode that is in ohmic contact with the second contact region. Diode region 1600D is formed for the purpose described below. When the chip is in an avalanche condition, a current flows into transistor cell 1600T in the chip only from the drain region immediately below transistor cell 1600T. However, a current also flows into outermost transistor cell 1600D from a region where a transistor cell is not formed around the chip, so that the current flowing therein becomes larger than the current flowing in the internal cell. Transistor cell 1600T includes a parasitic bipolar transistor contained of first conductive type source region 1604, second conductive type first well region 1603, and first conductive type drift layer 1602. Therefore, when a high current flows into first well region 1603 from drift layer 1602, the potential of the first well region increases due to the resistance of first well region 1603, and the parasitic bipolar transistor is turned on. This causes higher current, resulting in that the device is broken down in the worst case. To prevent the device from being broken down as described above, the source region is eliminated from outermost transistor cell 1600D to eliminate a parasitic bipolar transistor. That is, a mere PN diode contained of second well region 1615 and drift layer 1602 is formed.

Gate region 1600G includes first conductive type drift layer 1602 formed on first conductive type semiconductor substrate 1601, second conductive type second well region 1615 selectively formed on the surface of drift layer 1602, insulating film 1617 formed on the first conductive type drift layer, and gate electrode 1608 formed on insulating film 1617.

PTL 1 describes that breakdown of insulating film 1617 formed between the well region and the gate electrode in the gate region may occur according to the mechanism described below. Here, the first conductive type is specified as an n type, and the second conductive type is specified as a p type. When switching of the MOSFET from an on state to an off state occurs, the voltage of the drain electrode rapidly rises. Due to this voltage rise, a displacement current flows into the second conductive type well through the parasitic capacitance present between the p type well and the n type drift layer. At that time, a high displacement current flows in the region below the gate pad, that is, the region where the area of the p type well is extremely large, such as gate region 1600G. Although the displacement current flows into the source electrode at last, a potential rise given by a product of resistance of a current path to the source electrode and the displacement current occurs in the p type well. Particularly in the portion where the distance from the source electrode in the horizontal direction is large, a potential rise with a considerable value occurs in the p type well. Thus, when the gate electrode is formed on the p type well with a thin insulating film interposed, a large electric field is applied on the insulating film between the p type well and the gate electrode just after the switching of the MOSFET cell from the on state to the off state, and this might cause breakdown of the insulating film on the p type well.

Further, when an avalanche breakdown voltage at the termination portion is designed to be lower than an avalanche breakdown voltage of the cell region of the MOSFET, an avalanche current flows into the p type well region. Although not illustrated, the termination portion is formed at the right side (opposite side of diode region 1600D across gate region 1600G) in the figure. When the chip is in the avalanche breakdown, the avalanche current flows in the p type well below the gate pad from the termination portion to the diode region (from the right end to the left side in the figure). Therefore, as in the above mechanism, a voltage drop occurs in the p type well below the gate pad, resulting in that a large electric field is applied on insulating film 1617 on the p type well. This may cause breakdown of the insulating film below the gate pad. The similar phenomenon occurs on a gate line as well as on the gate pad.

In PTL 1, a field insulating film having larger thickness than the thickness of the gate insulating film is formed on the wide p well region to address the above problem. With this, an electric filed applied on the insulating film upon an occurrence of a potential rise in the p well is reduced to prevent breakdown of the insulating film below the gate pad.

Figure 17:
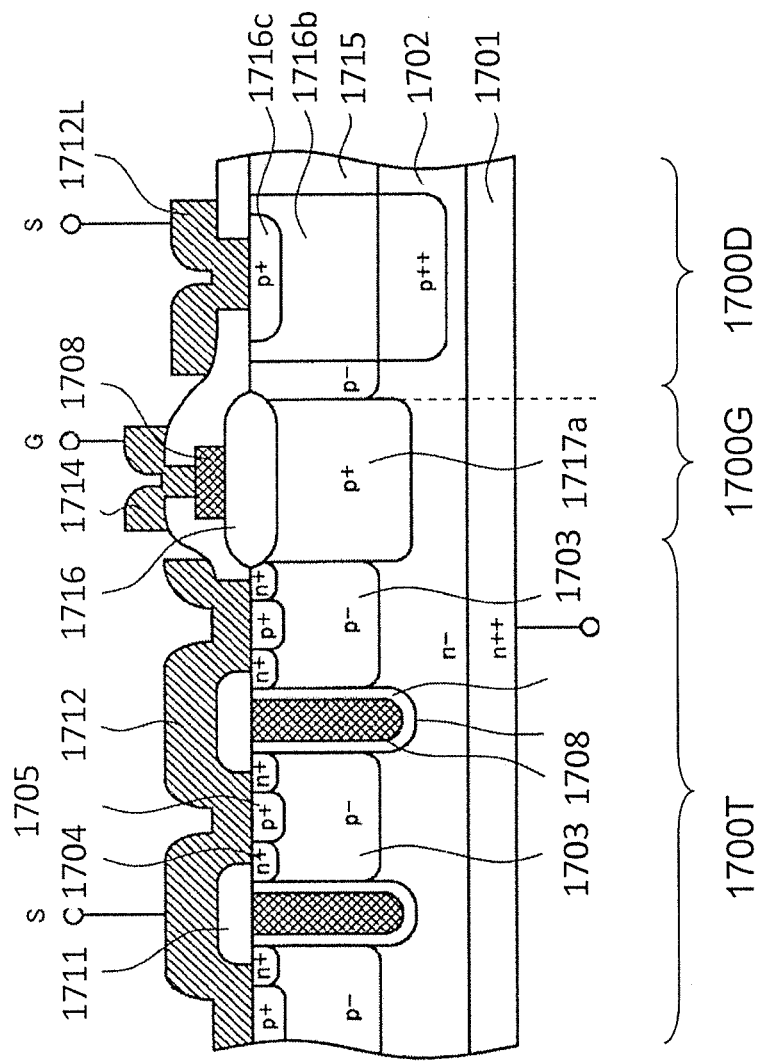
FIG. 17 is a schematic sectional diagram illustrating an SiC-MOSFET disclosed in PTL 2.

FIG. 17 illustrates a sectional schematic diagram illustrating a MOSFET disclosed in PTL 2. Gate region 1700G includes first conductive type drift layer 1702 formed on first conductive type semiconductor substrate 1701, second conductive type second well region 1717a selectively formed on the surface of the drift layer, insulating film 1716 formed on the first conductive type drift layer, and gate electrode 1708 formed on the insulating film. An impurity concentration of second conductive type second well region 1717a is set higher than an impurity concentration of first well region 1703 of transistor cell 1700T to reduce resistance of second well region 1717a. With this, a potential rise of the second well with the flow of the displacement current is suppressed to prevent breakdown of insulating film 1716. In addition, diode region 1700D is formed at the opposite side of transistor cell 1700 across gate region 1700G. Further, a second conductive type second contact region formed on diode region 1700D has a large impurity doping depth, and the impurity doping concentration is further increased. With this structure, a breakdown voltage (hereinafter referred to as BVD) of semiconductor element 1700 is determined in diode region 1700D. Since upper source line 1714L is formed on the top surface of diode region 1700D, an avalanche current upon avalanche breakdown can be released into upper source line 1712L without passing through the second well region on gate region 1700G. Thus, the potential rise in the second well region on gate region 1700G can be prevented. Consequently, breakdown of insulating film 1716 can be prevented.

On the other hand, formation of an epitaxial growth layer on the well region has also been proposed to improve low mobility of the SiC-MOSFET. In the SiC-MOSFET, first well region 1603 is generally formed by ion implantation. When activation annealing is performed after ion implantation, crystallinity of the first well region is recovered. However, different from Si, deficiency remains in the ion-implanted layer. Further, since the temperature during activation annealing is high such as 1600° C. or higher, surface roughness occurs on drift layer 1602. Therefore, when the surface of the first well region formed by ion implantation is used as it is as a channel, channel mobility of the FET is reduced. In addition, the gate insulating film formed by thermal oxidation of the surface of the first well region is bad in film property, and has a problem of variation in thickness. In view of this, it has been conventionally proposed that, in an SiC-MOSFET, an epitaxial growth layer is formed on a first well region and the surface thereof is used as a channel.

This is because the epitaxial growth layer has less crystal defect on its surface, and surface roughness on the base is suppressed.

However, according to the study of the inventors of the present application, in the conventional structure described above, a field insulating film having larger thickness than the thickness of a gate insulating film is formed on a p type well region having large area, such as a gate pad or a gate line portion. Therefore, a process for forming a field oxide film having larger thickness is required, separate from the gate insulating film. Further, in an SiC-MOSFET having an epitaxial channel layer, the field insulating film has to be formed between a process for forming the epitaxial channel layer and a process for forming a gate insulating film. Therefore, during the process for forming the field insulating film, quality deterioration of the gate insulating film may occur due to contamination or surface roughness on the metal-oxide-semiconductor (MOS) interface between the epitaxial channel layer and the gate insulating film.

In view of the circumstances described above, the inventors of the present application has conceived a silicon carbide semiconductor device that can prevent breakdown of an insulating film in a gate region at the time of switching and avalanche breakdown without deteriorating quality of the gate insulating film even in an SiC-MOSFET including an epitaxial channel layer. The outline of the silicon carbide semiconductor device disclosed in the present application is as stated below.

A silicon carbide semiconductor device according to an exemplary embodiment of the present application includes a laminated structure that includes a first conductive type semiconductor substrate, a first conductive type first silicon carbide semiconductor layer located on a main surface of the semiconductor substrate, and a first ohmic electrode located on a back surface of the semiconductor substrate, the laminated structure including a transistor region, a termination region, and a diode region, each region including a part of the semiconductor substrate, a part of the first silicon carbide semiconductor layer, and a part of the first ohmic electrode, as viewed in a direction perpendicular to the main surface of the semiconductor substrate the termination region surrounds the transistor region and the diode region is located between the termination region and the termination region. The transistor region includes a plurality of unit cell regions. The silicon carbide semiconductor device includes, in each of the unit cell regions: a second conductive type first well region located in a part of the first silicon carbide semiconductor layer; a first conductive type source region located in the first well region; a second silicon carbide semiconductor layer formed on a part of the first silicon carbide semiconductor layer so as to be in contact with at least a part of the first well region and a part of the source region, the second silicon carbide semiconductor layer including a first conductive type layer having a lower impurity concentration than an impurity concentration of at least the first silicon carbide semiconductor layer; a gate insulating film on the second silicon carbide semiconductor layer; a gate electrode located on the gate insulating film; a second ohmic electrode electrically connected to the source region; and an upper electrode electrically connected to the second ohmic electrode. The silicon carbide semiconductor device according to the exemplary embodiment also includes, in the diode region, a second conductive type second well region, a contact region, a second silicon carbide semiconductor layer, an insulating film, a gate electrode, a gate line, a gate pad, a third ohmic electrode, and a source line, and includes, in the termination region, a second conductive type impurity region. The second conductive type second well region is located in a part of the first silicon carbide semiconductor layer. The contact region is located in the second well region and has a higher impurity concentration than an impurity concentration of the second well region. The second silicon carbide semiconductor layer is formed on a part of the first silicon carbide semiconductor layer so as to be in contact with at least a part of the contact region. The insulating film is formed on the second silicon carbide semiconductor layer and has a thickness substantially same as a thickness of the gate insulating film. The gate electrode is formed on at least a part of the insulating film. The gate line is located on the contact region and electrically connected to the gate electrode. The gate pad is located on the contact region and electrically connected to the gate line for establishing external connection. The third ohmic electrode is electrically connected to at least a region located between the gate line and the transistor region and a region located between the gate line and the termination region in the contact region. The source line is electrically connected to the third ohmic electrode and the upper electrode on each of the unit cell regions. The second conductive type impurity region is located in a part of the first silicon carbide semiconductor layer in the termination region.

The silicon carbide semiconductor device may further include, between the gate line in the diode region and the termination region, at least one unit cell having a structure same as a structure of the unit cell region in the transistor region.

The laminated structure may have a shape of a substantially rectangle as viewed in a direction perpendicular to the main surface of the semiconductor substrate, and a breakdown voltage of the termination region on two corners closer to the gate pad out of four corners of the rectangle may be higher than a breakdown voltage of the termination region on at least one of the other two corners.

In the termination region, the impurity region may constitute a field limiting ring (FLR), and a radius of the impurity region on two corners closer to the gate pad may be larger than a radius of the impurity region on at least one of the other two corners.

In the termination region, the impurity region may constitute an FLR structure, and a width of the impurity region on two corners closer to the gate pad may be larger than a width of the impurity region on at least one of the other two corners.

The silicon carbide semiconductor device may have the following configuration. The silicon carbide semiconductor device includes a plurality of the third ohmic electrodes between the gate line in the diode region and the transistor region. The plurality of the third ohmic electrodes located between the gate line and the transistor region has a rectangular or a circular shape as viewed in a direction perpendicular to the main surface of the semiconductor substrate. A third ohmic electrode closest to a corner of the second well region, out of the plurality of the third ohmic electrodes, has an area larger than an area of a third ohmic electrode adjacent to the third ohmic electrode closest to the corner of the second well region.

The third ohmic electrode located between the gate line in the diode region and the transistor region may have a stripe shape as viewed in a direction perpendicular to the main surface of the semiconductor substrate, and a width of the stripe may be maximized at a corner of the second well region.

In the diode region, the second well region may be divided into multiple regions, and a space between the divided multiple second well regions may be equal to or less than a space between the divided multiple second well regions and the first well region.

An exemplary embodiment of a silicon carbide semiconductor device according to the present disclosure will be described below with reference to the drawings. In the present exemplary embodiment, two conductive types of semiconductor are specified such that a first conductive type is an n type and a second conductive type is a p type. However, the first conductive type may be a p type, and the second conductive type may be an n type. In addition, a symbol of "+" or "−" at an upper-right part of each conductive type indicates a relative concentration of impurities. For example, "n+" means that an n type impurity concentration is higher than that indicated by "n", and "n−" means that an n type impurity concentration is lower than that indicated by "n".

Further, in the present exemplary embodiment, a semiconductor device is a MOSFET. However, a semiconductor device may have an insulated gate bipolar transistor (IGBT) structure. In this case, an impurity region corresponds to an emitter or a collector, a first ohmic electrode corresponds to an emitter electrode or a collector electrode, and a second ohmic electrode corresponds to a collector electrode or an emitter electrode.

Exemplary Embodiment

Figure 1A:
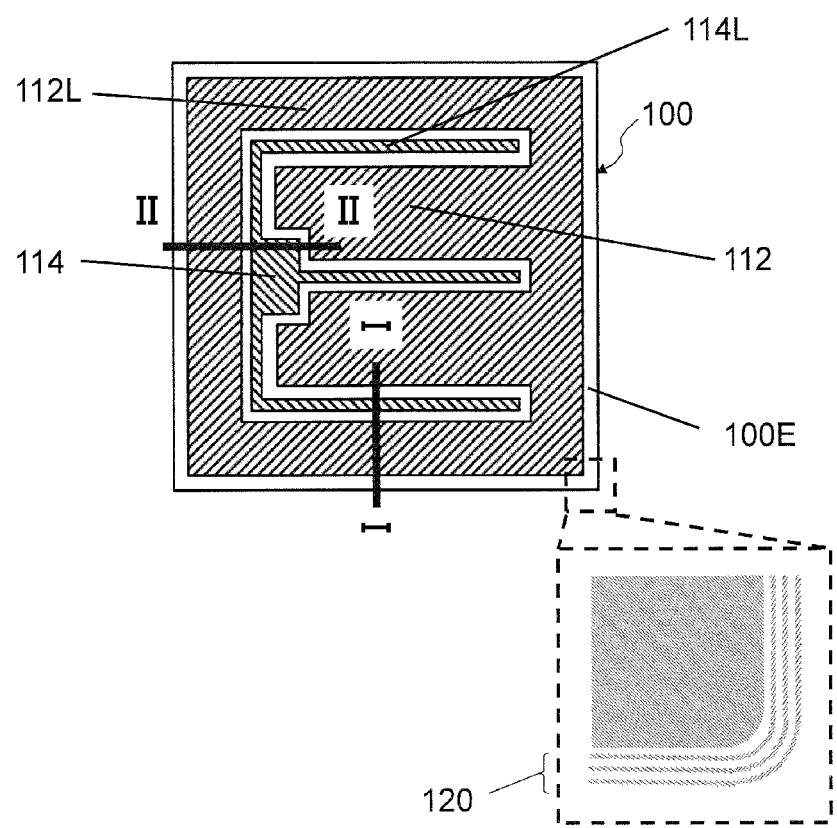
FIG. 1A is a plan view illustrating one example of a silicon carbide metal-oxide-semiconductor field-effect transistor (SiC-MOSFET) according to an exemplary embodiment.
Figure 1B:
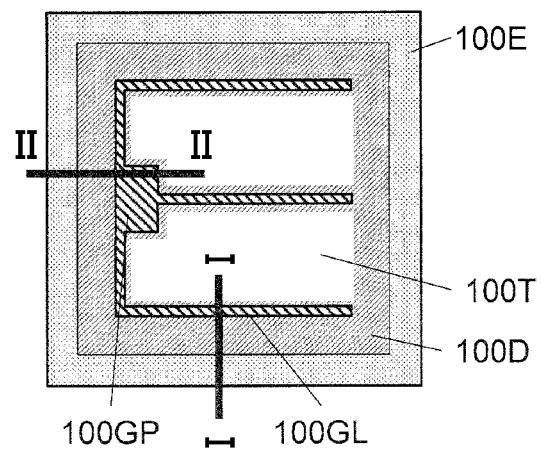
FIG. 1B is a plan view illustrating an arrangement of a transistor region, a termination region, and a diode region of the SiC-MOSFET according to the exemplary embodiment.
Figure 2:
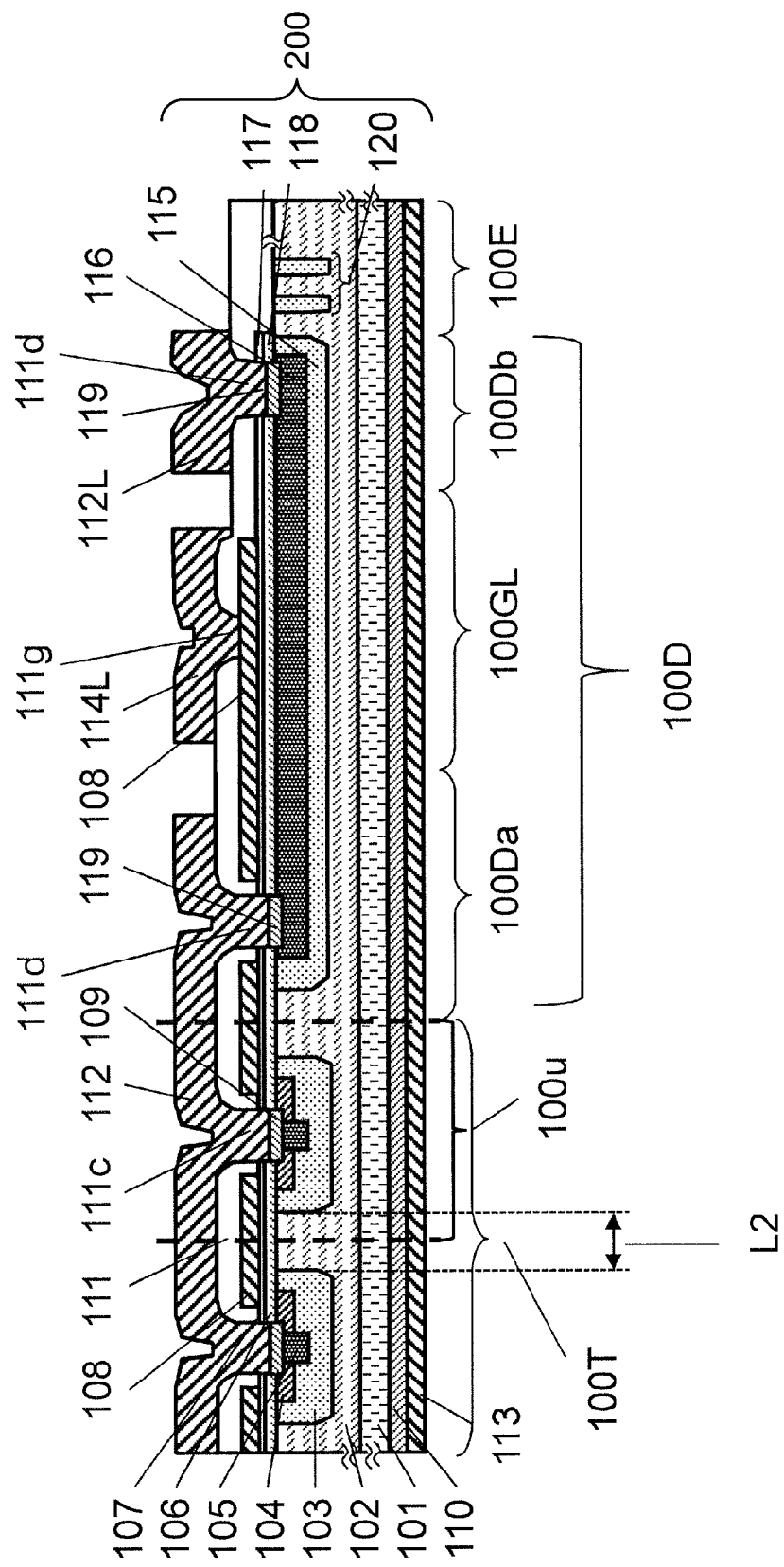
FIG. 2 is a schematic sectional diagram illustrating one example of the SiC-MOSFET along line I-I in FIG. 1A according to the exemplary embodiment.
Figure 3:
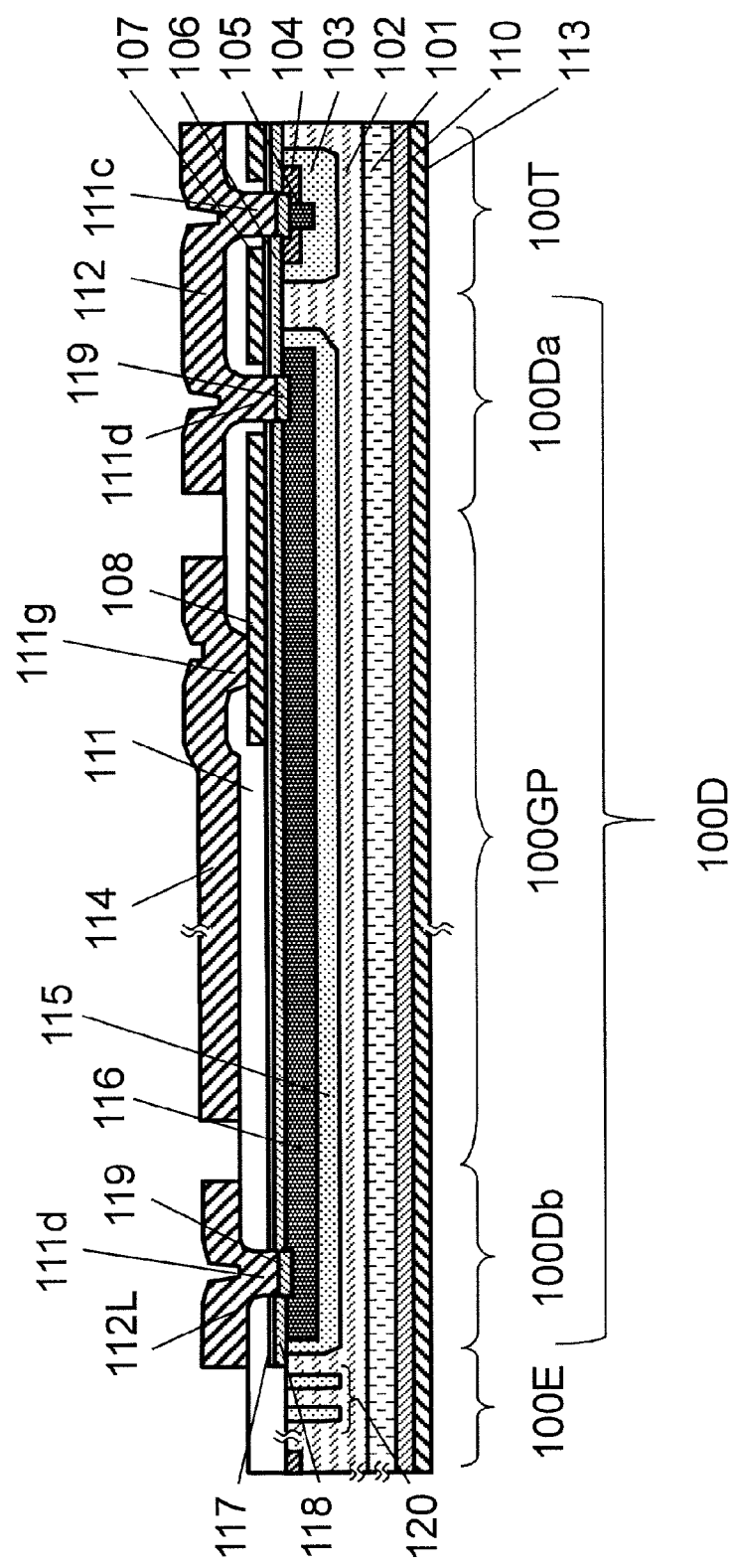
FIG. 3 is a schematic sectional diagram illustrating one example of the SiC-MOSFET along line II-II in FIG. 1A according to the exemplary embodiment.

A silicon carbide semiconductor device according to the present disclosure will be described below with reference to FIGS. 1A, 1B, 2, and 3. FIG. 1A is a schematic plan view of silicon carbide semiconductor device 100 (hereinafter referred to as silicon carbide metal-oxide-semiconductor field-effect transistor (SiC-MOSFET) 100) viewed from a main surface side of a semiconductor substrate according to the present exemplary embodiment. FIG. 2 is a schematic sectional diagram along line I-I in FIG. 1A, and FIG. 3 is a schematic sectional diagram along line II-II in FIG. 1A.

<Structure>

SiC-MOSFET 100 according to the present exemplary embodiment includes laminated structure 200. Laminated structure 200 includes n+ type SiC substrate (semiconductor substrate) 101, drift layer (first silicon carbide semiconductor layer) 102 located on the main surface of SiC semiconductor substrate 101, and drain electrode (first ohmic electrode) 110 located on the back surface of SiC semiconductor substrate 101.

Laminated structure 200 includes transistor region 100T, termination region 100E, and diode region 100D, each region including a part of SiC semiconductor substrate 101, a part of drift layer 102, and a part of drain electrode 110. FIG. 1B schematically illustrates the arrangement of these regions as viewed in a direction perpendicular to the main surface of SiC semiconductor substrate 101. As illustrated in FIG. 1B, termination region 100E surrounds transistor region 100T, and diode region 100D is located between termination region 100E and transistor region 100T. Diode region 100D includes gate line region 100GL and gate pad region 100GP.

As illustrated in FIGS. 2 and 3, transistor region 100T includes a plurality of unit cell regions 100u. Each of the plurality of unit cell regions 100u functions as a MOSFET, and they are connected to each other in parallel. That is, a transistor cell is configured in unit cell region 100u, and SiC-MOSFET 100 includes a plurality of transistor cells. A plurality of unit cell regions 100u is two-dimensionally disposed as viewed in the direction perpendicular to the main surface of SiC semiconductor substrate 101.

As described above, diode region 100D includes gate line region 100GL and gate pad region 100GP. Thus, on the cross-section including gate line region 100GL and gate pad region 100GP, diode region 100D is separated into diode region 100Da and diode region 100Db. Diode region 100Da is disposed to be adjacent to transistor region 100T, and diode region 100Db is disposed to be adjacent to termination region 100E.

The transistor cell formed in each unit cell region includes a part of SiC semiconductor substrate 101, a part of drift layer 102, channel layer (second silicon carbide semiconductor layer) 106 formed on drift layer 102, gate insulating film 107 located on channel layer 106, gate electrode 108 located on gate insulating film 107, source electrode (second ohmic electrode) 109, and a part of drain electrode 110. First well region 103 having a conductive type different from the conductive type of SiC semiconductor substrate 101 is formed in a part of drift layer 102 (here, first well region 103 is of p type). n+ type source region 104 containing n type impurities at a high concentration and p+ type first contact region 105 containing p type impurities at a concentration higher than that in first well region 103 are formed in first well region 103. First well region 103, source region 104, and first contact region 105 are formed by a process for implanting impurities into drift layer 102 and a high-temperature heat treatment (activation annealing) process for activating impurities implanted into drift layer 102, for example.

Source region 104 and drift layer 102 are connected through channel layer 106. Channel layer 106 is a 4H—SiC layer formed on drift layer 102 by epitaxial growth. Further, first contact region 105 and source region 104 each constitute an ohmic contact with source electrode 109. Thus, first well region 103 is electrically connected to source electrode 109 through first contact region 105.

For example, source electrode 109 can be formed by a process in which, after formation of a conductive material (Ni) layer on source region 104 and first contact region 105 on drift layer 102, the resultant is thermally treated at high temperature.

Gate insulating film 107 is a thermally oxidized film ($SiO_2$ film) formed by thermally oxidizing the surface of channel layer 106, for example. Gate electrode 108 is formed by using conductive polysilicon, for example.

Gate electrode 108 is covered by interlayer insulating film 111. Contact hole 111c is formed on interlayer insulating film 111. Source electrode 109 in each unit cell is connected to upper electrode (for example, Al electrode) 112 in parallel through contact hole 111c. Drain electrode 110 may further be provided with back line electrode 113.

Next, the structure of SiC-MOSFET 100 at termination region 100E will be described. Termination region 100E constitutes a termination structure. Silicon carbide semiconductor has breakdown electric field intensity more than ten times as high as that of Si. Therefore, it is important in a silicon carbide semiconductor device to suppress breakdown due to electric field concentration on the surface structure of the semiconductor device, and the termination structure relaxes electric field concentration on the surface of laminated structure 200.

SiC-MOSFET 100 has p type ring region (impurity region) 120 located in a part of the first silicon carbide semiconductor layer on termination region 100E. p type ring region 120 has a ring shape surrounding transistor region 100T as viewed in the direction perpendicular to the surface of SiC semiconductor substrate 101. In the present exemplary embodiment, a plurality of ring regions 120 is provided to constitute an FLR structure. Each ring has a rectangular shape with four corners rounded into an arc as viewed in the direction perpendicular to the surface of SiC semiconductor substrate 101. Since four corners of each ring are rounded into an arc, electric field concentration on four corners can be prevented. For example, ring region 120 has an impurity concentration profile substantially equal to that of first well region 103 in transistor region 100T and second well region 115 in the depth direction.

Next, the structure of SiC-MOSFET 100 on diode region 100D will be described.

On gate line region 100GL in diode region 100D, SiC-MOSFET 100 includes drift layer 102 formed on the main surface of SiC semiconductor substrate 101, epitaxial layer (second silicon carbide semiconductor layer) 118 formed on drift layer 102, gate electrode 108 formed on epitaxial layer 118 with insulating film 117 interposed, and gate line 114L electrically connected to gate electrode 108. Drift layer 102 in gate line region 100GL has second well region 115 having a conductive type different from the conductive type of SiC semiconductor substrate 101 (here, second well region 115 is of p type). p+ type second contact region 116 containing p type impurities at a higher concentration than that in second well region 115 is formed in second well region 115. Second contact region 116 is formed under whole gate electrode 108 in order to reduce electric resistance in second well region 115 below gate electrode 108. Second well region 115 has an impurity concentration profile equal to that of first well region 103 in the depth direction. Similarly, second contact region 116 has an impurity concentration profile substantially equal to that of first contact region 105 in the depth direction.

Gate electrode 108 is covered by interlayer insulating film 111 that is provided with contact hole 111g, and through contact hole 111g, gate line 114L and gate electrode 108 are electrically connected to each other. Insulating film 117 is a thermally oxidized ($SiO_2$) film formed by thermally oxidizing the surface of epitaxial layer 118, for example. Insulating film 117 is formed by the same process as that for forming gate insulating film 107 and has substantially the same thickness as that of gate insulating film 107, for example.

On diode region 100Da, SiC-MOSFET 100 includes drift layer 102 formed on the main surface of SiC semiconductor substrate 101, second well region 115 having a conductive type different from the conductive type of SiC semiconductor substrate 101 (here, second well region 115 is of p type), and base electrode 119 (third ohmic electrode). p+ type second contact region 116 containing p type impurities at a higher concentration than that in second well region 115 is formed in second well region 115. Second contact region 116 forms an ohmic contact with base electrode 119. Thus, second well region 115 is electrically connected to the base electrode through the second contact region. Base electrode 119 can be formed by a process in which, after formation of a conductive material (Ni) layer on second contact region 116 on drift layer 102, the resultant is thermally treated at high temperature, for example. Base electrode 119 is formed from the same material as that of source electrode 109. Further, an interlayer insulating film covering gate electrode 108 formed on the drift layer is provided with contact hole 111d, and second well region 115 is electrically connected to upper electrode 112 through base electrode 119.

On diode region 100Db, SiC-MOSFET 100 includes drift layer 102 formed on the main surface of SiC semiconductor substrate 101, second well region 115 having a conductive type different from the conductive type of SiC semiconductor substrate 101 (here, second well region 115 is of p type), and base electrode 119. p+ type second contact region 116 containing p type impurities at a higher concentration than that in second well region 115 is formed in second well region 115. Second contact region 116 forms an ohmic contact with base electrode 119. Thus, second well region 115 is electrically connected to the base electrode through the second contact region. Base electrode 119 can be formed by a process in which, after formation of a conductive material (Ni) layer on second contact region 116 on drift layer 102, the resultant is thermally treated at high temperature, for example. Base electrode 119 is formed from the same material as that of source electrode 109. The interlayer insulating film is provided with contact hole 111d, by which second well region 115 is electrically connected to source line 112L through base electrode 119.

As illustrated in FIG. 3, the structure of SiC-MOSFET 100 on gate pad region 100GP is substantially similar to the structure on gate line region 100GL illustrated in FIG. 2. The difference from gate line region 100GL is that gate pad 114 is formed on an extremely wide region for connection of gate electrode 108 to the outside. As a result, second well region 115 is extremely wide. In addition, gate electrode 108 is formed below at least a part of gate pad 114 for electrical connection between gate pad 114 and gate electrode 108. Drift layer 102 in gate pad region 100GP has second well region 115 having a conductive type different from the conductive type of SiC semiconductor substrate 101 (here, second well region 115 is of p type). p+ type second contact region 116 containing p type impurities at a higher concentration than that in second well region 115 is formed in second well region 115. Second contact region 116 is formed under whole gate electrode 108 in order to reduce electric resistance in the p type well region below the gate.

Further, second well region 115 has an impurity concentration profile substantially equal to that of first well region 103 in the depth direction. Second contact region 116 has an impurity concentration profile substantially equal to that of first contact region 105 in the depth direction.

In addition, gate electrode 108 is covered by interlayer insulating film 111 that is provided with contact hole 111g, and through contact hole 111g, gate pad 114 and gate electrode 108 are electrically connected to each other. For example, insulating film 117 is a thermally oxidized ($SiO_2$) film formed by thermally oxidizing the surface of epitaxial layer 118, and is formed from the same material as that of gate insulating film 107.

<Operation and Function>

Next, the operation of SiC-MOSFET 100 will be described.

In each unit cell region 100u of SiC-MOSFET 100, a MOSFET is constituted by channel layer 106, gate electrode 108 that controls a current flowing through channel layer 106, gate insulating film 107, source electrode 109 electrically connected to channel layer 106, and drain electrode 110.

When a threshold voltage of the MOSFET is defined as Vth, the MOSFET is turned on in the case of Vgs≤Vth. If Vds>0 V, a current flows from drain electrode 110 to source electrode 109 through SiC semiconductor substrate 101, drift layer 102, channel layer 106, and source region 104.

On the other hand, if Vgs<Vth, the MOSFET is turned off as a transistor. As described above, the MOSFET can be switched between on and off by controlling Vgs. Generally, a switching element for driving a load such as a power converter or a motor has high resistance while being turned off, so that a drain-source voltage (Vds) increases. On the other hand, the switching element has low resistance while being turned on, so that the drain-source voltage decreases.

In addition, a pn junction between a drift layer and a well region is structurally present between a source and drain of a vertical SiC-MOSFET. As a result, capacitance (Cds) caused by a depletion layer formed by this pn junction is generated between the drain and source.

Considering that the MOSFET is switched to the off state from the on state, a displacement current flows into the well through the drain-source capacitance generated between the drift layer and the well region due to the rapid change in the drain-source voltage. The area of the PN junction formed by first well region 103 and drift layer 102 in each of unit cell regions 100u is about one digit smaller than the area of the PN junction formed by second well region 115 and drift layer 102. Therefore, a displacement current flowing through unit cell region 100u of transistor region 100T is relatively small. Further, since the distance from the end of first well region 103 to source electrode 109 is short, the distance of a path of a displacement current flowing through first well region 103 is also short. Therefore, the resistance in first well region 103 is small, so that a potential rise in first well region 103 is a little.

However, second well region 115 on gate line region 100GL and gate pad region 100GP is about one digit larger than first well region 103. Therefore, a large displacement current flows therein through drain-source capacitance generated in second well region 115. In the present exemplary embodiment, diode regions 100Da and 100Db are formed to sandwich gate line region 100GL where source electrode 109 or base electrode 119 cannot be disposed as described above. Thus, the displacement current flowing into second well region 115 is dispersed in diode regions 100Da and 100Db to flow out to upper electrode 112 and upper source line 112L through base electrode 119 formed on each cell.

In addition, second contact region 116 having a higher impurity concentration than that of second well region 115 is formed below gate electrode 108. Thus, the electric resistance below gate electrode 108 can be held low, and the potential rise due to the displacement current can be suppressed.

Further, epitaxial layer 118 is formed on second contact region 116, and insulating film 117 is formed by thermally oxidizing the surface of epitaxial layer 118. It has been known that, in an SiC semiconductor layer, surface roughness or ion crystal fault is left due to ion implantation at a high concentration. Therefore, film property of an oxide film formed by thermally oxidizing the surface of SiC to which ion implantation is performed at a high concentration is worse than film property of an oxide film formed by thermally oxidizing the surface of an epitaxial layer. In the present exemplary embodiment, epitaxial layer 118 is formed on second contact region 116 having a high impurity concentration, whereby resistance of second well region 115 below insulating film 117 is reduced without deterioration of the film property of insulating film 117.

As described above, breakdown of insulating film 117 on second well region 115 can be prevented by the dispersion of the displacement current, reduction in resistance of second well region 115 below gate electrode 108, and high-quality insulating film 117 below gate electrode 108.

Next, the operation of SiC-MOSFET 100 in avalanche breakdown will be described. SiC-MOSFET 100 according to the present exemplary embodiment includes the FLR structure on termination region 100E. As described above, the FLR structure includes second conductive type ring region 120 having a ring shape as viewed in the direction perpendicular to the main surface of SiC semiconductor substrate 101. A surface electric field is controllable by changing the impurity concentration of ring region 120 and the width of ring region 120 viewed in the direction perpendicular to the main surface of SiC semiconductor substrate 101. That is, an avalanche breakdown voltage can be controlled. Here, the operation when a breakdown voltage of the device is determined by termination region 100E, i.e., when the avalanche breakdown voltage of termination region 100E is lower than the avalanche breakdown voltage of transistor region 100T, will be described.

When a voltage is applied between the drain and source, the device firstly reaches the avalanche breakdown voltage at termination region 100E. Specifically, an electric field at the end of second well region 115 close to termination region 100E in gate line region 100GL or gate pad region 100GP is increased, so that avalanche breakdown occurs at the end of second well region 115 close to termination region 100E. Therefore, the resistance of the pn junction of gate line region 100GL or gate pad region 100GP close to termination region 100E is decreased, and an avalanche current flows into second well region 115 in the state in which the drain-source voltage is clamped by the avalanche breakdown voltage. Since diode region 100Db is formed at the end of second well region 115 close to termination region 100E in the present exemplary embodiment, the avalanche current flows toward source line 112L serving as the upper line electrode through base electrode 119 on diode region 100Db without passing through the second well region below gate electrode 108. Thus, the potential rise of second well region 115 below the gate line is suppressed, whereby breakdown of insulating film 117 on second well region 115 can be prevented.

Figure 7A:
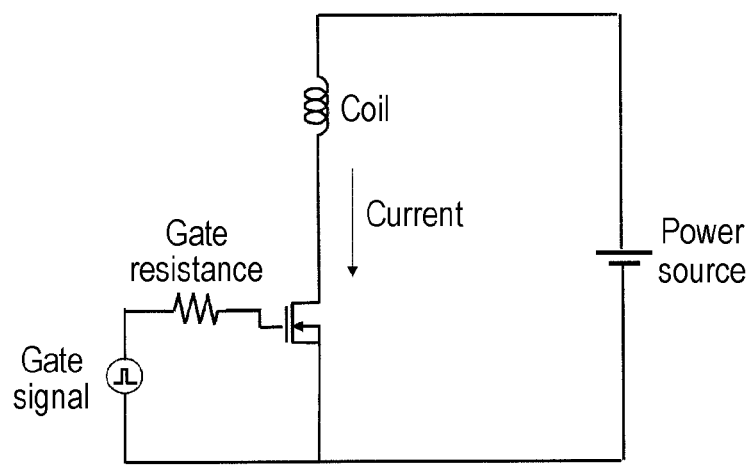
FIG. 7A is a circuit diagram illustrating an example of measurement of an avalanche resistance value.

To confirm the effect of the SiC-MOSFET according to the present exemplary embodiment, an avalanche resistance value is evaluated. An avalanche resistance value has been known as one index indicating characteristics in an avalanche breakdown state. An avalanche resistance value indicates an amount of energy before a semiconductor element is broken when a current is flown between a drain and source of a transistor in an off state of the transistor, i.e., in an avalanche breakdown state. If the resistance value is large, the characteristics are good, and if small, the characteristics are bad. FIG. 7A illustrates one example of a circuit that measures an avalanche resistance value. In the circuit for measuring avalanche resistance, a coil and a transistor which is a D.U.T (Device Under Test) are connected to a power source in series. Further, the circuit is configured to receive a gate signal for an on-off control of the transistor.

Upon the measurement of an avalanche resistance value, a gate signal is firstly applied to the transistor for a certain period of time. With this, the resistance of the transistor is temporarily lowered, so that the voltage of the power source is mostly applied to the coil. Any current according to the voltage applied to the coil, the time, and the inductance of the coil flows through the circuit.

Then, when the transistor is switched to the off state from the on state, the current flowing through the transistor tends to be decreased. However, electromotive force is generated at both ends of the coil due to electrostatic induction to allow the current to continuously flow through the coil. As a result, the voltage applied between the drain and source of the transistor increases, whereby the element reaches an avalanche breakdown voltage. The resistance of the semiconductor element which reaches the avalanche breakdown voltage is lowered, and an avalanche current flows between the drain and source with the state in which the drain-source voltage is clamped by the avalanche breakdown voltage. Thereafter, the current flowing through the coil and the transistor is decreased due to the parasitic resistance of the circuit, so that the circuit is returned to the normal off state. The avalanche resistance value is defined by the value of integral of the voltage and current until the current becomes zero after the occurrence of the avalanche breakdown.

Figure 8A:
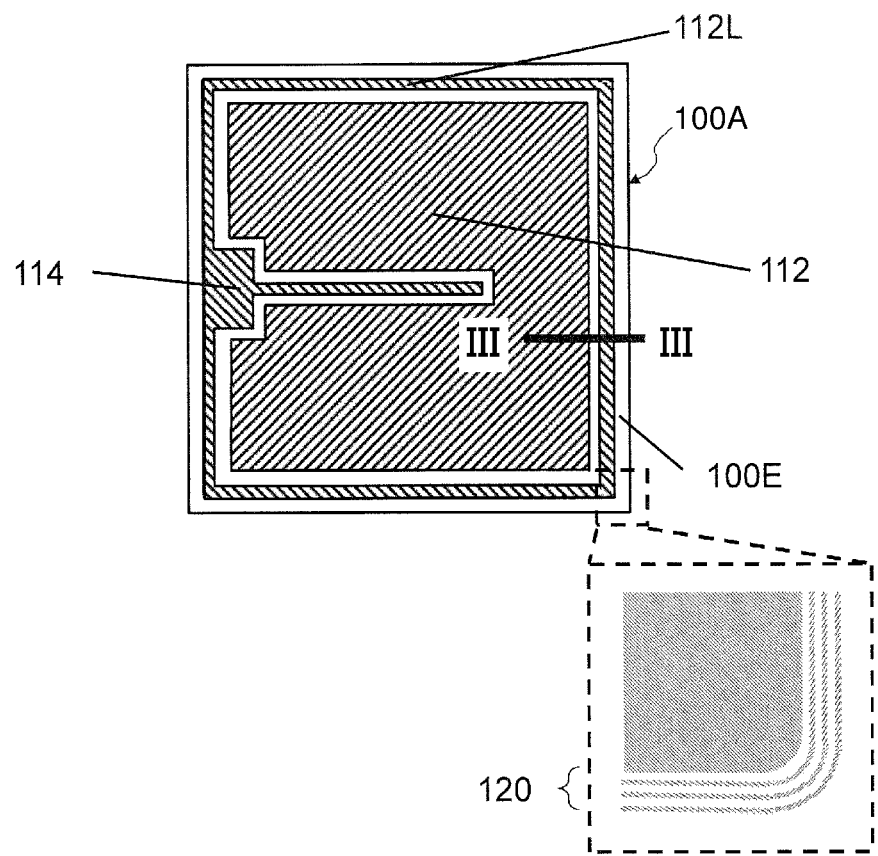
FIG. 8A is a plan view illustrating a structure of an SiC-MOSFET according to the comparative example.
Figure 8B:
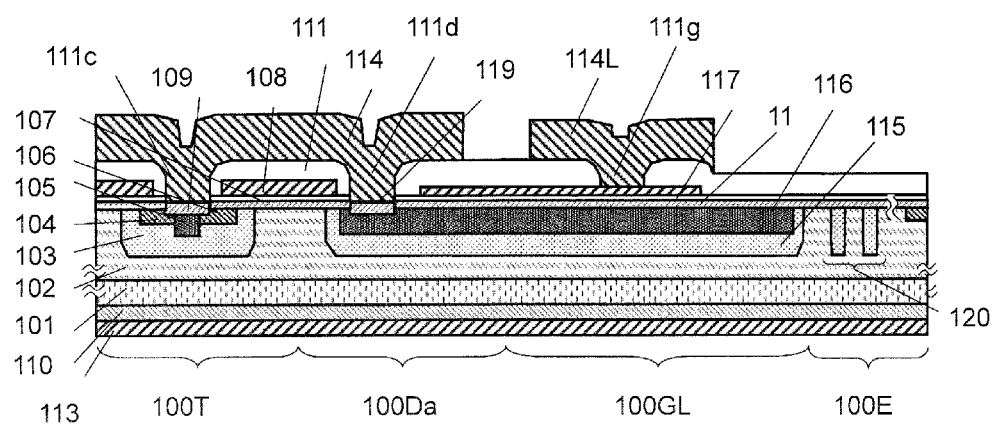
FIG. 8B is a sectional diagram illustrating the structure of the SiC-MOSFET according to the comparative example.

In comparison, SiC-MOSFET 100A is manufactured as SiC-MOSFET 100 having no diode region 100Db, and an avalanche resistance value is measured. FIGS. 8A and 8B schematically illustrate the surface structure and the cross-sectional structure of SiC-MOSFET 100A. For easy understanding, the components having the similar function to those in SiC-MOSFET 100 are identified by the same reference numerals in FIGS. 8A and 8B.

Figure 7B:
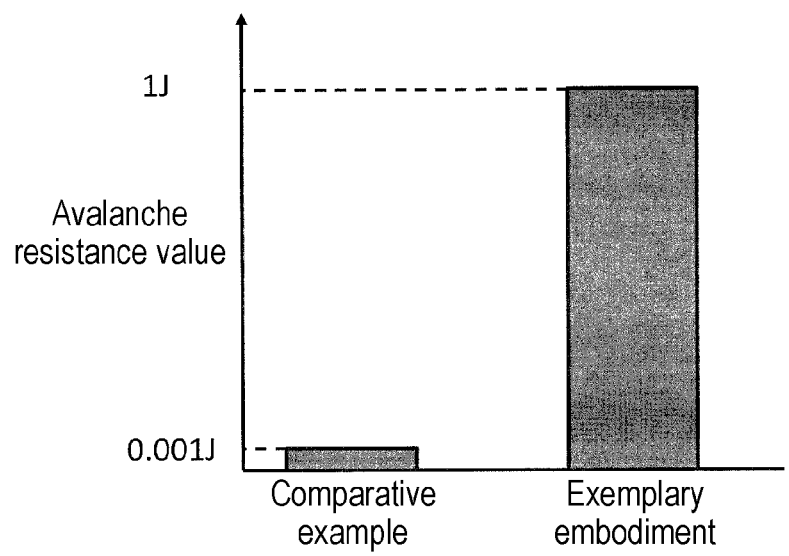
FIG. 7B is a diagram illustrating a measurement result of avalanche resistance values of SiC-MOSFETs according to the exemplary embodiment and a comparative example.

FIG. 7B illustrates avalanche resistance values of SiC-MOSFET 100 according to the exemplary embodiment and SiC-MOSFET 100A according to the comparative example. The avalanche resistance value of SiC-MOSFET 100 according to the present exemplary embodiment is 1 J, while the avalanche resistance value of SiC-MOSFET 100A according to the comparative example is 1 mJ. That is, the avalanche resistance value of SiC-MOSFET 100 according to the present exemplary embodiment is about three digits higher than that in the comparative example. It is considered that, in SiC-MOSFET 100 according to the present exemplary embodiment, the avalanche current flows toward source line 112L serving as the upper line electrode through base electrode 119 in diode region 100Db, which suppresses the potential rise in second well region 115 below the gate line to prevent breakdown of insulating film 117 on second well region 115 as described above.

On the other hand, since diode region 100Db is not formed, the avalanche current flows out to base electrode 119 from diode region 100Da through second well region 115 in SiC-MOSFET 100A according to the comparative example. Therefore, a considerable potential rise occurs at the portion with a large distance from base electrode 119 on the path in the second well through which the avalanche current flows, as in the time of switching. Thus, a large electric field is applied to insulating film 117 on second well region 115, resulting in that breakdown of insulating film 117 occurs. Consequently, the avalanche resistance value decreases.

Notably, for simplifying the description, the avalanche breakdown on I-I cross-section and II-II cross-section of SiC-MOSFET 100 according to the present exemplary embodiment and on III-III cross-section of SiC-MOSFET 100A (see FIGS. 8A and 8B) according to the comparative example is described above. However, such operation is not limited to the position of the illustrated cross-sections. The similar operation is performed even in the case where avalanche breakdown occurs at the corners of the FLR as viewed in the direction perpendicular to the main surface of SiC semiconductor substrate 101.

As described above, the present exemplary embodiment can prevent the thin oxide film below gate electrode 108 from being broken down. Notably, the present exemplary embodiment describes the case where second contact region 116 is continuously formed in gate line region 100GL below gate electrode 108 and in diode regions 100Da and 100Db. However, second contact region 116 is not necessarily continuously formed. For example, a portion where second contact region 116 is not formed may be present at about the middle between the two base contacts on the diode region.

Further, the termination structure in the termination region is not limited to the FLR structure. The similar effect can be obtained even by a junction termination extension structure or a mesa structure.

<Manufacturing Method>

One example of a manufacturing method of the semiconductor device according to the present disclosure will be described with reference to FIGS. 4A to 6D. Note that specific numerical values, materials and process conditions described below are only illustrative, and the present invention is not limited to the manufacturing method described below.

Figure 4A:
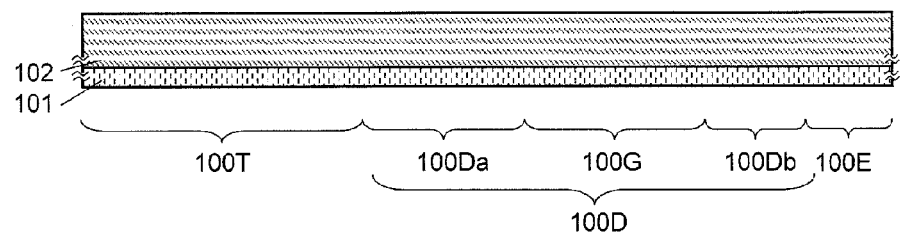
FIG. 4A is a process sectional diagram illustrating a manufacturing process of the SiC-MOSFET according to the exemplary embodiment.
Figure 4B:
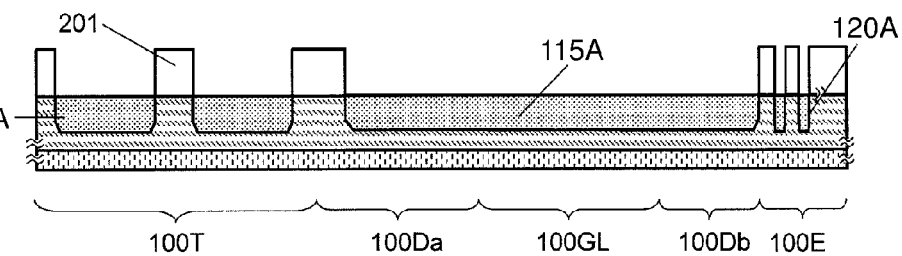
FIG. 4B is a process sectional diagram illustrating the manufacturing process of the SiC-MOSFET according to the exemplary embodiment.

Firstly, SiC semiconductor substrate 101 is prepared. For example, SiC semiconductor substrate 101 is an n type 4H—SiC offcut substrate having low resistance (resistivity: 0.02 Ωcm). As illustrated in FIG. 4A, high-resistance drift layer (first silicon carbide semiconductor layer) 102 is epitaxially grown on SiC semiconductor substrate 101. Before the formation of drift layer 102, a buffer layer contained of SiC having a high impurity concentration may be deposited on SiC semiconductor substrate 101. The impurity concentration of the buffer layer is $1 \times 10^{18}$ cm$^{-3}$, and the thickness of the buffer layer is 1 μm, for example. Drift layer 102 is contained of n type 4H—SiC, and its impurity concentration and thickness are $1 \times 10^{16}$ cm$^{-3}$ and 10 μm, for example.

Then, mask 201 formed from SiO$_2$, for example, is formed on drift layer 102, and Al (aluminum) ion, for example, is implanted into drift layer 102. With this, first well implantation region 103A, second well implantation region 115A, and ring implantation region 120A are simultaneously formed. For example, the concentration of Al ion is about $2 \times 10^{17}$ cm$^{-3}$, and energy and dose amount of the ion implantation are adjusted such that the depth of the implanted Al ion is about 0.5 μm to 1.0 μm. The depth here corresponds to the distance from the surface of the drift layer to the position where the concentration of the implanted Al ion is equal to the n type impurity concentration of the drift layer. The depth profile of the impurity concentration in the direction perpendicular to the main surface of SiC semiconductor substrate 101 is substantially equal among first well implantation region 103A, second well implantation region 115A, and ring implantation region 120A.

Figure 4C:
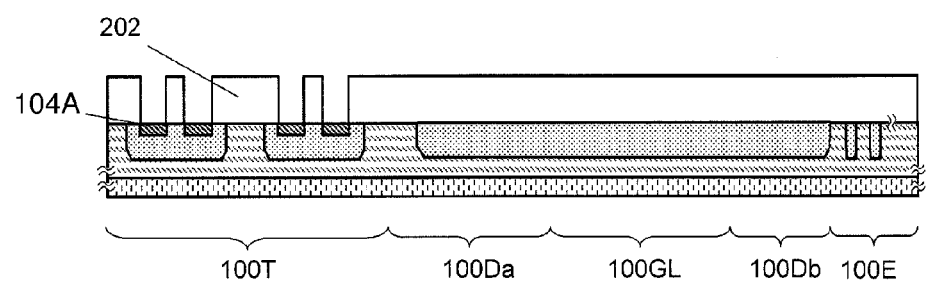
FIG. 4C is a process sectional diagram illustrating the manufacturing process of the SiC-MOSFET according to the exemplary embodiment.

Next, as illustrated in FIG. 4C, mask 201 is removed after the ion implantation, and then, nitrogen ion, for example, is implanted into first well implantation region 103A with use of mask 202 contained of SiO$_2$, for example, to form source implantation region 104A. Alternatively, SiO$_2$ or the like may further be deposited with a part of mask 201 being left, and a side wall mask of mask 201 may be formed with partial processing to form a mask corresponding to mask 202. That is, a self-alignment process for forming source implantation region 104A with respect to first well implantation region 103A and second well implantation region 115A in a self-aligning manner may be applied. The ion implantation profile is adjusted such that the depth of source implantation region 104A is 250 nm and the average impurity concentration is about $5 \times 10^{19}$ cm$^{-3}$, for example.

Figure 4D:
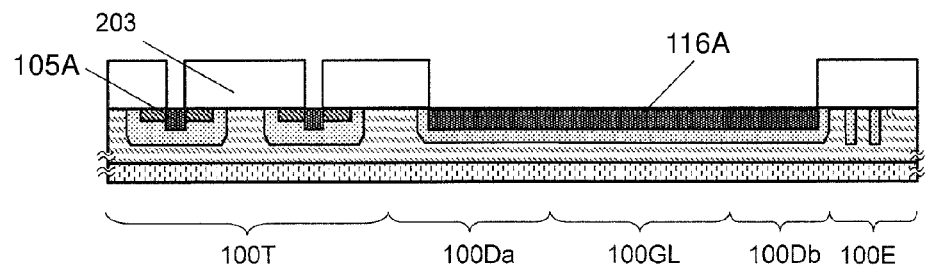
FIG. 4D is a process sectional diagram illustrating the manufacturing process of the SiC-MOSFET according to the exemplary embodiment.

After the ion implantation, mask 202 is removed, and as illustrated in FIG. 4D, Al is implanted after the formation of mask 203. With this, first contact implantation region 105A and second contact implantation region 116A are formed. The depth of first contact implantation region 105A and second contact implantation region 116A is 400 nm, for example, the average impurity concentration is about $1 \times 10^{20}$ cm$^{-3}$, and the depth thereof is set such that the impurity concentration of $5 \times 10^{17}$ cm$^{-3}$ can be obtained, for example.

Next, mask 203 is removed. The region of drift layer 102 where first well implantation region 103A, source implantation region 104A, and first contact implantation region 105A are not formed in transistor region 100T, viewed from top of SiC semiconductor substrate 101, is defined as a junction field-effect transistor (JFET) region. A first conductive type implantation region may be formed on the JFET region to cover the JFET region, as viewed from top of semiconductor substrate 101. The JFET implantation region is formed by implanting N ion, for example. It is preferable that the JFET implantation region is formed to the position deeper than first well implantation region 103A from the surface of drift layer 102 with respect to the direction perpendicular to SiC semiconductor substrate 101. For example, the average impurity concentration of the JFET implantation region is set to be about $1 \times 10^{17}$ cm$^{-3}$.

After these ion implantation processes, a high-temperature heat treatment (activation annealing) for activating the impurities implanted into drift layer 102 is performed. With this, first well region 103, second well region 115, ring region 120, source region 104, first contact region 105, and second contact region 116 are formed. The activation annealing can be implemented by depositing a carbon film on drift layer 102 by a thickness of about 200 nm, and performing a heat treatment at about 1700° C. for about 30 minutes under an atmosphere of inert gas such as Ar or N$_2$ or in vacuum.

Note that the surface layer of drift layer 102 may be removed for cleaning the surface of drift layer 102 after the activation annealing. For example, when the surface layer of drift layer 102 is removed by 50 nm, the depths of first well region 103, second well region 115, ring region 120, source region 104, first contact region 105, and second contact region 116 are all decreased by about 25 nm.

Figure 5A:
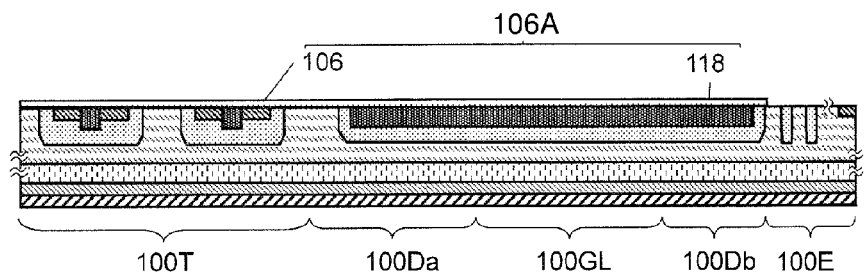
FIG. 5A is a process sectional diagram illustrating the manufacturing process of the SiC-MOSFET according to the exemplary embodiment.

Next, as illustrated in FIG. 5A, silicon carbide semiconductor layer 106A is epitaxially grown on the entire surface of drift layer 102 including first well region 103, second well region 115, ring region 120, source region 104, first contact region 105, and second contact region 116. In the present exemplary embodiment, the deposition formation condition of silicon carbide semiconductor layer 106A in FIG. 5A is adjusted such that the impurity concentration N (cm$^{-3}$) and thickness d (nm) of silicon carbide semiconductor layer 106A satisfy the following conditions, for example. Silicon carbide semiconductor layer 106A is epitaxial layer 118 in diode region 100D. Notably, silicon carbide semiconductor layer 106A may extend to transistor region 100T. In this case, silicon carbide semiconductor layer 106A is channel layer 106 in transistor region 100T, and epitaxial layer 118 in diode region 100D. That is, channel layer 106 and epitaxial layer 118 are simultaneously formed.

$N=2 \times 10^{18}$ cm$^{-3}$ $d=30$ nm

Figure 5B:
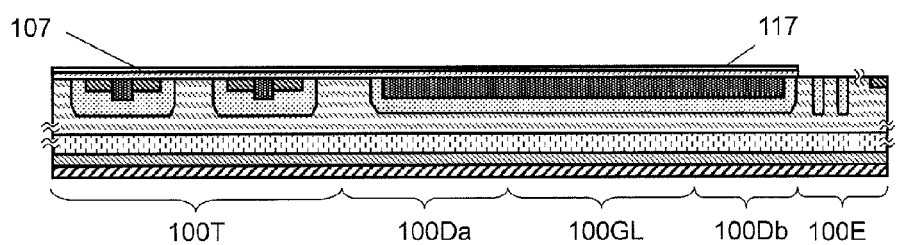
FIG. 5B is a process sectional diagram illustrating the manufacturing process of the SiC-MOSFET according to the exemplary embodiment.

Then, after dry etching of a predetermined portion of silicon carbide semiconductor layer 106A, gate insulating film 107 and insulating film 117 are simultaneously formed on the surface of silicon carbide semiconductor layer 106A, which is left after the etching, by thermal oxidation as illustrated in FIG. 5B, for example. Gate insulating film 107 is located on transistor region 100T, and insulating film 117 is located on diode region 100D. In the case where gate insulating film 107 and insulating film 117 are formed by thermal oxidation, a part of silicon carbide semiconductor layer 106A may become gate insulating film 107 and insulating film 117. Therefore, in consideration of the thickness lost by the thermal oxidation, the thickness of silicon carbide semiconductor layer 106A to be formed is adjusted such that thickness d described above is obtained after the formation of gate insulating film 107 and insulating film 117. For example, silicon carbide semiconductor layer 106A is formed to have a thickness larger than d by about 50 nm. Silicon carbide semiconductor layer 106A after the formation of gate insulating film 107 and insulating film 117 through the process for cleaning silicon carbide semiconductor layer 106A before the formation of the gate insulating film and the process for forming the gate insulating film has thickness d.

Thereafter, a polycrystalline silicon film to which phosphor is doped in an amount of about $7 \times 10^{20}$ cm$^{-3}$ is deposited on the surface of gate insulating film 107. The thickness of the polycrystalline silicon film is about 500 nm, for example.

Figure 5C:
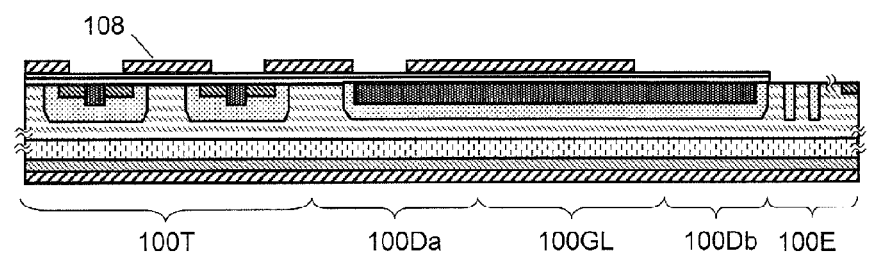
FIG. 5C is a process sectional diagram illustrating the manufacturing process of the SiC-MOSFET according to the exemplary embodiment.

Next, as illustrated in FIG. 5C, the polycrystalline silicon film is dry etched using a mask (not illustrated), whereby gate electrode 108 is formed on a desired region. Then, interlayer insulating film 111 contained of SiO$_2$, for example, is deposited to cover the surface of gate electrode 108 and the surface of drift layer 102 by a chemical vapor deposition (CVD) method. The thickness of interlayer insulating film 111 is 1 µm, for example.

Figure 5D:
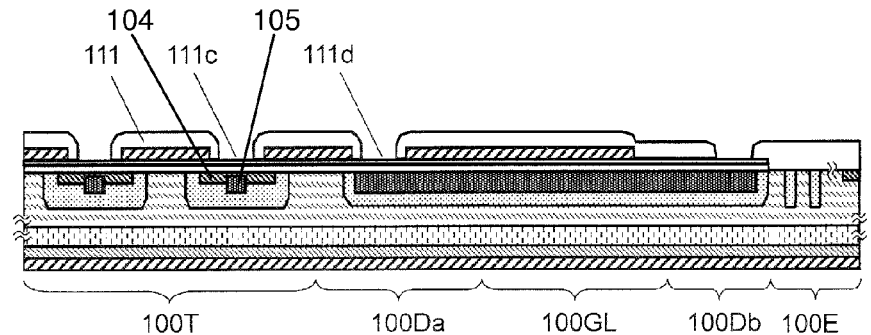
FIG. 5D is a process sectional diagram illustrating the manufacturing process of the SiC-MOSFET according to the exemplary embodiment.

Next, as illustrated in FIG. 5D, interlayer insulating film 111, gate insulating film 107, and insulating film 117 on the surface of first contact region 105 and on a part of the surface of impurity region 104 are removed by dry etching using a photoresist mask (not illustrated) to form contact holes 111c and 111d.

Figure 6A:
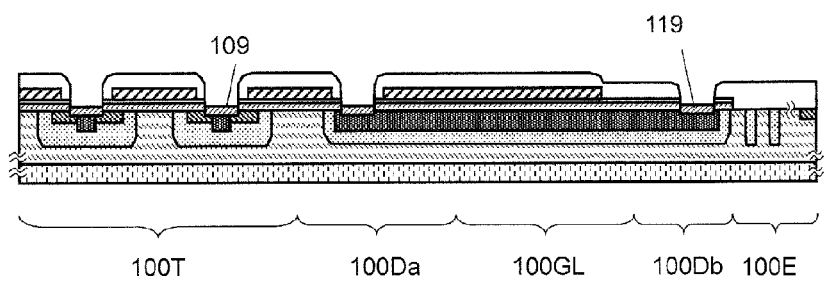
FIG. 6A is a process sectional diagram illustrating the manufacturing process of the SiC-MOSFET according to the exemplary embodiment.

Thereafter, an Ni film with a thickness of about 100 nm is formed on interlayer insulating film 111 having contact holes 111c and 111d. With a heat treatment at a temperature of 950° C. for 1 minute under an inert atmosphere, the Ni film is reacted with drift layer 102 to form an ohmic electrode contained of Ni silicide. Then, the Ni film on interlayer insulating film 111 is removed by etching, whereby source electrode 109 and base electrode 119 illustrated in FIG. 6A are formed.

Figure 6B:
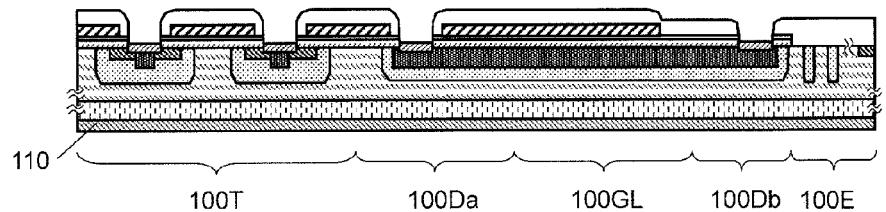
FIG. 6B is a process sectional diagram illustrating the manufacturing process of the SiC-MOSFET according to the exemplary embodiment.

Next, Ni is also deposited on the entire back surface of SiC semiconductor substrate 101, and the Ni is similarly reacted with the back surface of SiC semiconductor substrate 101 with the heat treatment to form drain electrode 110 contained of Ni silicide as illustrated in FIG. 6B.

Figure 6C:
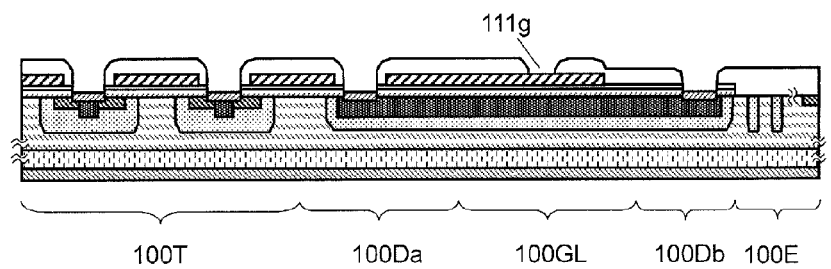
FIG. 6C is a process sectional diagram illustrating the manufacturing process of the SiC-MOSFET according to the exemplary embodiment.

Then, after the formation of a photoresist mask (not illustrated), a part of interlayer insulating film 111 is etched to expose a part of gate electrode 108 on gate line region 100GL, whereby gate contact hole 111g is formed as illustrated in FIG. 6C.

Figure 6D:
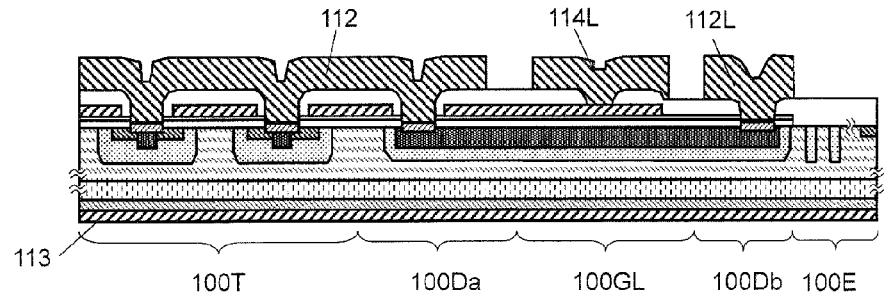
FIG. 6D is a process sectional diagram illustrating the manufacturing process of the SiC-MOSFET according to the exemplary embodiment.

Next, an aluminum film with a thickness of about 4 µm is deposited on the surface, and the resultant is etched into a desired pattern. With this, as illustrated in FIG. 6D, upper electrode 112, gate line 114L, gate pad, and upper source line 112L are formed. Further, Ti/Ni/Ag is deposited on the back surface of drain electrode 110 as back line electrode 113 for die bond, for example. (The Ti side is in contact with drain electrode 110). In this way, SiC-MOSFET 100 illustrated in FIGS. 1A to 3 is obtained.

Although not particularly illustrated in the present exemplary embodiment, it is to be noted that a passivation film having an opening on a part of upper electrode 112 or a part of gate pad 114 may further be deposited on interlayer insulating film 111, gate line 114L, or upper electrode 112.

First Modification

A first modification of the semiconductor device according to the present exemplary embodiment will be described with reference to FIG. 9.

Since a high current such as a displacement current or avalanche current flows through the source line in diode region 100Db as described in the above exemplary embodiment, the width of the source line is preferably set as wide as possible. However, when only diode region 100Db is formed below an upper source line, the region other than the transistor is increased in the entire chip, so that an amount of current per chip area is decreased and on resistance is increased. Specifically, area efficiency is deteriorated. The first modification is characterized in that a transistor cell is also disposed below the source line. With this configuration, the reduction in an amount of current per chip area when the width of the source line is increased can be reduced.

Figure 9:
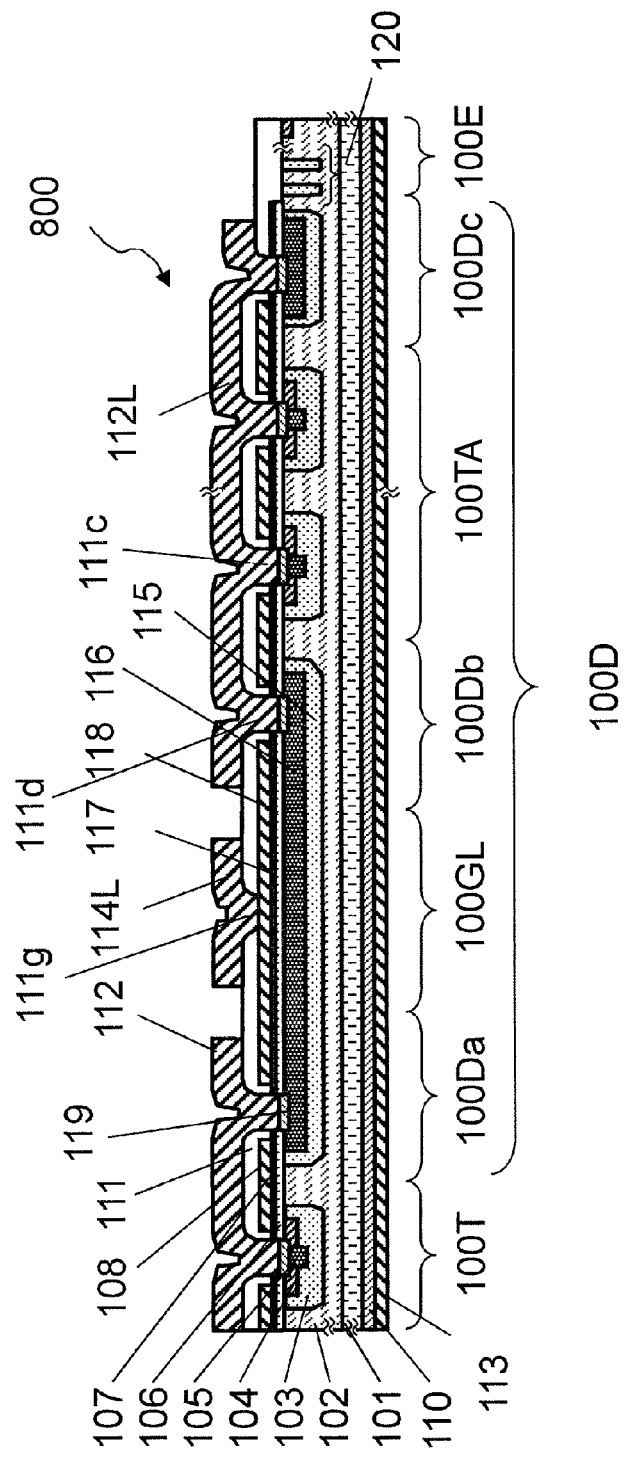
FIG. 9 is a schematic sectional diagram illustrating one example of an SiC-MOSFET according to a first modification.

FIG. 9 illustrates a schematic sectional diagram of the first modification of the present exemplary embodiment. SiC-MOSFET semiconductor device 800 according to the first modification includes transistor region 100TA in diode region 100D between diode region 100Db and termination region 100E. SiC-MOSFET semiconductor device 800 also includes diode region 100Dc between transistor region 100TA and termination region 100E. Transistor region 100TA includes at least one unit cell region 100$u$. For example, unit cell region 100$u$ in transistor region 100TA has the same structure as that of unit cell region 100$u$ in transistor region 100T.

This configuration can implement an increase in the width of upper source line 112L without reducing a current through the transistor. Particularly upon avalanche breakdown, a high current is likely to flow through the source line due to the reason described below, and therefore, the upper source line has to be configured to be sufficiently wide.

The breakdown voltage of the transistor cell formed in transistor region 100T is determined by the breakdown voltage of the PN junction formed by first well region 103 and drift layer 102. The breakdown voltage of the termination structure of FLR on termination region 100E is determined by the width of the ring, the number of rings, and a curvature of the ring at the corner of the chip. In the case where the breakdown voltage of the transistor cell is designed to be lower than the breakdown voltage of the termination structure, an avalanche current dispersively flows into all unit cells in the chip, and flows out to the outside through upper electrode 112 serving as a source pad for applying a source voltage from the outside and through an unillustrated wire bonded to the source pad. Upper electrode 112 serving as the source pad is wider than source line 112L.

However, in the case where the breakdown voltage of the transistor cell is designed to be higher than the breakdown voltage of the termination structure, avalanche breakdown occurs first at the termination structure, and an avalanche current flows only through the termination structure. Further, electric field concentration is likely to occur on the portion of the termination structure located at the corners of the chip, and the avalanche current may locally flow through this portion. In FIG. 1A, the avalanche current flowing through the left termination structure of the chip has to pass through source line 112L which is thinner than the source pad before flowing into the source pad. In view of this, it is necessary that the width of the upper source line is designed to prevent the upper source line from being broken even if all of the avalanche current flows therethrough.

For example, when upper source line 112L is formed from aluminum having a thickness of 3 μm, allowable instantaneous current is about $5 \times 10^6$ A/cm$^2$. If the avalanche current is 30 A, a width of 200 μm is required for upper source line 112L. If the chip size is 1 mm×1 mm, the area of the upper source line occupies about 40% of the entire chip. If the diode region is present entirely below the source line, on current does not flow through this region. Thus, the region where the on current flows is only about 60% of the entire chip, so that the current per area is extremely low. In view of this, if transistor region 100TA is also formed below upper source line 112L as in the first modification, the reduction in an amount of current per chip area can be prevented while the source line is ensured to be wide.

SiC-MOSFET 800 according to the first modification can be manufactured by the similar manufacturing method only by changing a mask layout of SiC-MOSFET 100 according to the exemplary embodiment described above.

Second Modification

Figure 10:
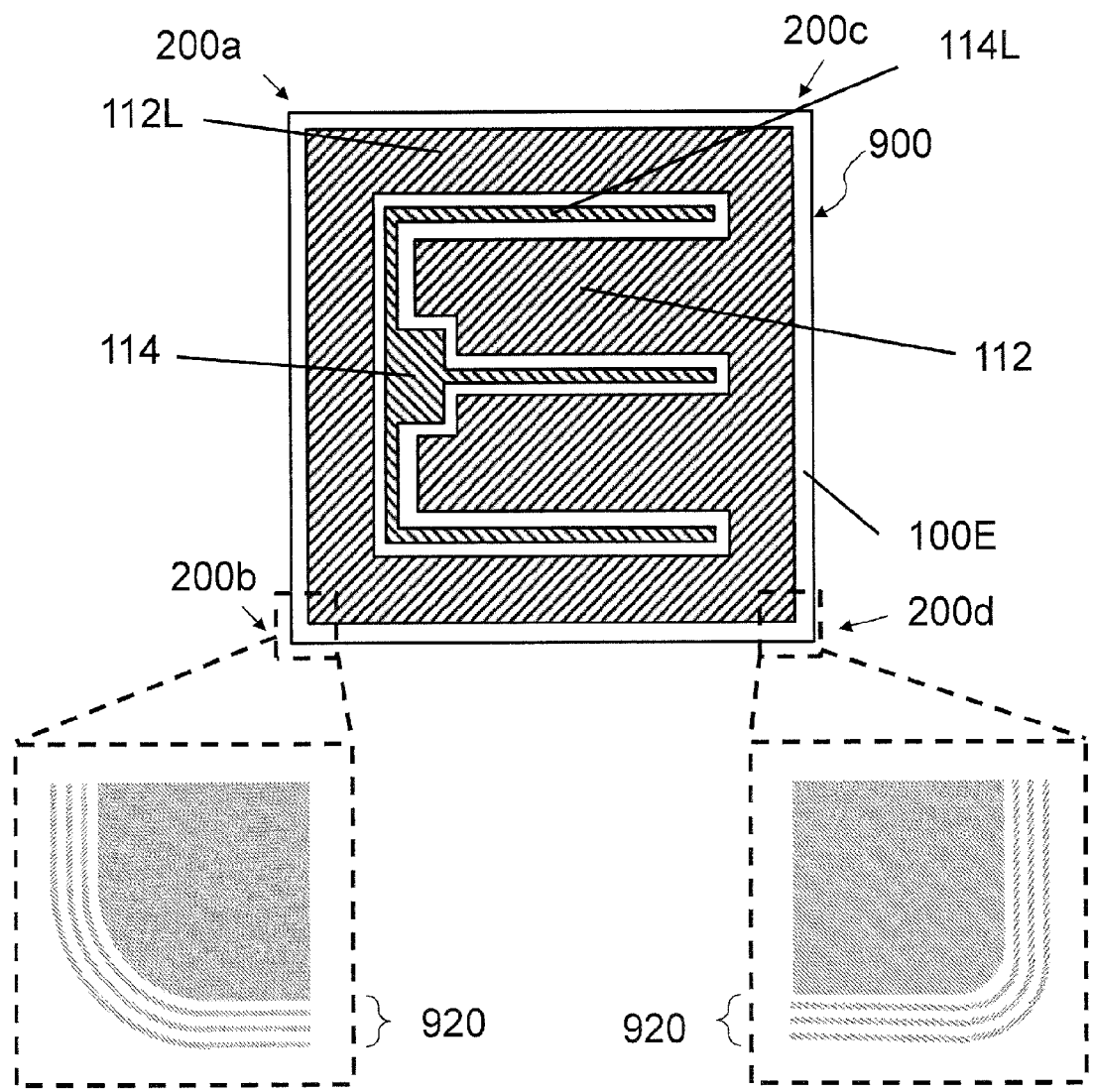
FIG. 10 is a plan view illustrating one example of an SiC-MOSFET according to a second modification.

A second modification of the semiconductor device according to the present exemplary embodiment will be described with reference to FIG. 10. Upper source line 112L has a thinner region in comparison with the upper electrode, and thus, it is preferable to prevent a high current from flowing through upper source line 112L as much as possible. Particularly upon avalanche breakdown, it is likely that a current equivalent to a rated current flows toward the outside from the corners through the upper source line. In SiC-MOSFET 900 according to the second modification of the present exemplary embodiment, laminated structure 200 has substantially a rectangular shape as viewed in the direction perpendicular to the main surface of SiC semiconductor substrate 101. The breakdown voltage of termination region 100E at corners 200$a$, 200$b$ which are located closer to gate pad 114 out of four corners 200$a$, 200$b$, 200$c$, 200$d$ is higher than the breakdown voltage of termination region 100E on at least one of the other two corners 200$c$, 200$d$. In other words, the breakdown voltage of termination region 100E on at least one of corners 200$c$, 200$d$ is lower than the breakdown voltage of termination region 100E on corners 200$a$, 200$b$.

With this structure, an avalanche current can be flown out to the outside through a wire bonded to gate pad 114 without passing through thin source line 112L.

As described above, the breakdown voltage of the transistor cell is determined by the breakdown voltage of the PN junction formed by first well region 103 and drift layer 102. The breakdown voltage of the termination structure of FLR is determined by the width of the ring, the number of rings, and a curvature of the ring at the corner of the chip. In the case where the breakdown voltage of the transistor cell is designed to be lower than the breakdown voltage of the termination structure, an avalanche current dispersively flows into all unit cells in the chip, and flows out to the outside through wide upper electrode 112 and through an unillustrated wire bonded to upper electrode 112.

However, in the case where the breakdown voltage of the transistor cell is designed to be higher than the breakdown voltage of the termination structure, avalanche breakdown occurs first at the termination structure, and an avalanche current flows only through the termination structure. Further, electric field concentration is likely to occur on the portion of the termination structure located at the corners of the chip, and the avalanche current may locally flow through this portion. In FIG. 1A, the avalanche current flowing through the left termination structure of the chip has to pass through source line 112L which is thinner than upper electrode 112 before flowing into upper electrode 112. In order to allow the avalanche current to flow out to the outside through the bonded wire without passing through thin source line 112L, it is necessary to make it difficult to cause avalanche breakdown on the termination structure at corners 200a, 200b of the chip in FIG. 10.

Figure 11A:
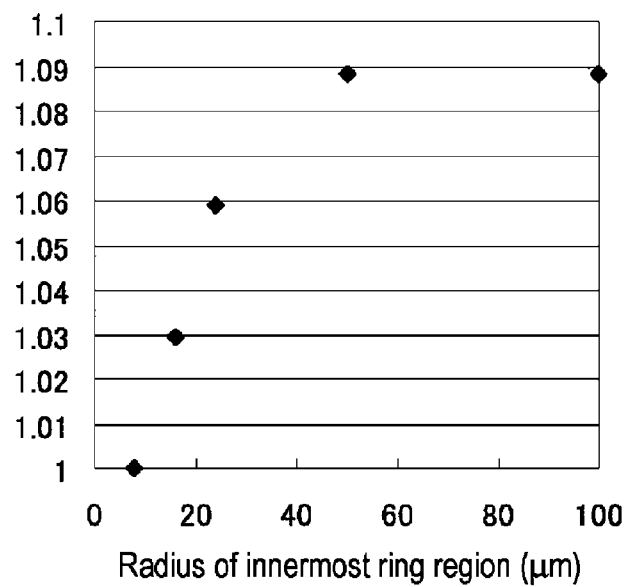
FIG. 11A is a graph illustrating a change in a breakdown voltage when a field limiting ring (FLR) structure is changed in the SiC-MOSFET according to the second modification.

For example, when termination region 100E has the FLR structure, the radius of the ring in the FLR at corners 200a, 200b may be set larger than the radius of the ring in the FLR at corners 200c, 200d as viewed in the direction perpendicular to the main surface of SiC semiconductor substrate 101. More specifically, the radius of ring region 120 which is the innermost ring of the FLR at corners 200a, 200b is set to be 100 µm, and the radius of ring region 120 which is the innermost ring of the FLR at corners 200c, 200d is set to be 16 µm. FIG. 11A illustrates dependency of normalized breakdown voltage (BVD) on the radius of innermost ring region 120 of the FLR. The vertical axis is normalized with values when the radius of innermost ring region 120 of the FLR is 8 µm. When the radius is changed as described above, an avalanche breakdown voltage can be changed by about ±5%. Therefore, avalanche breakdown occurs in the FLR on corners 200c, 200d which are distant from gate pad 114 (which are close to upper electrode 112), whereby the avalanche current can be released to upper electrode 112 without passing through upper source line 112L. Accordingly, it is not necessary to consider the avalanche current for the determination of the width of source line 112L, whereby the width of the upper source line can be decreased. Thus, the region where the transistor cell can be disposed is increased, whereby an amount of current per unit area can be increased.

Figure 11B:
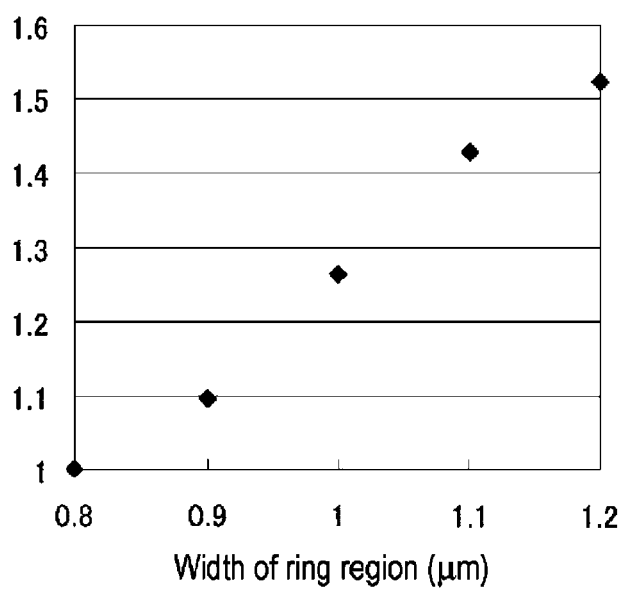
FIG. 11B is a graph illustrating a change in a breakdown voltage when a FLR structure is changed in the SiC-MOSFET according to the second modification.

Further, the width of ring region 120 that is the ring in the FLR at corners 200a, 200b may be set larger than the width of ring region 120 that is the ring in the FLR at corners 200c, 200d as viewed in the direction perpendicular to the main surface of SiC semiconductor substrate 101. For example, the width of ring region 120 in the FLR at corners 200a, 200b may be 1.0 µm, and the width of ring region 120 in the FLR at corners 200c, 200d may be 0.9 µm. FIG. 11B illustrates dependency of normalized BVD on the width of the impurity region in the FLR. This result is brought by changing the region to which p type is implanted with the interval of the arrangement of rings being constant. In this case, the implantation width of ring region 120 is varied with the interval being set as 2 µm. The vertical axis is normalized with the values when the width of the ring region in the FLR is 0.8 µm. When the width of the ring region in the FLR is changed as described above, an avalanche breakdown voltage can be changed by about ±10%. Accordingly, the operation and effect similar to those obtained by changing the radius of curvature of the FLR can be obtained.

SiC-MOSFET 900 according to the second modification can be manufactured by the similar manufacturing method only by changing a mask layout of SiC-MOSFET 100 according to the exemplary embodiment described above.

Third Modification

A third modification of the semiconductor device according to the present exemplary embodiment will be described with reference to FIG. 12.

In gate pad region 1100GP for external connection, the second well region is wide in comparison with gate line region 100GL. Therefore, a high displacement current flows through gate pad region 1100GP, and thus, the gate pad region does not preferably have a region where a thin insulating film is present alone. SiC-MOSFET 1100 according to the third modification does not have gate electrode 108 in gate pad region 1100GP. With this, an interlayer insulating film is present directly on a thin insulating film with a gate electrode being not formed in the gate pad region. According to this structure, an electric field applied to the insulating film is relaxed when a high displacement current flows, and this can prevent insulating film 117 in gate pad region 1100GP from being broken down.

Figure 12:
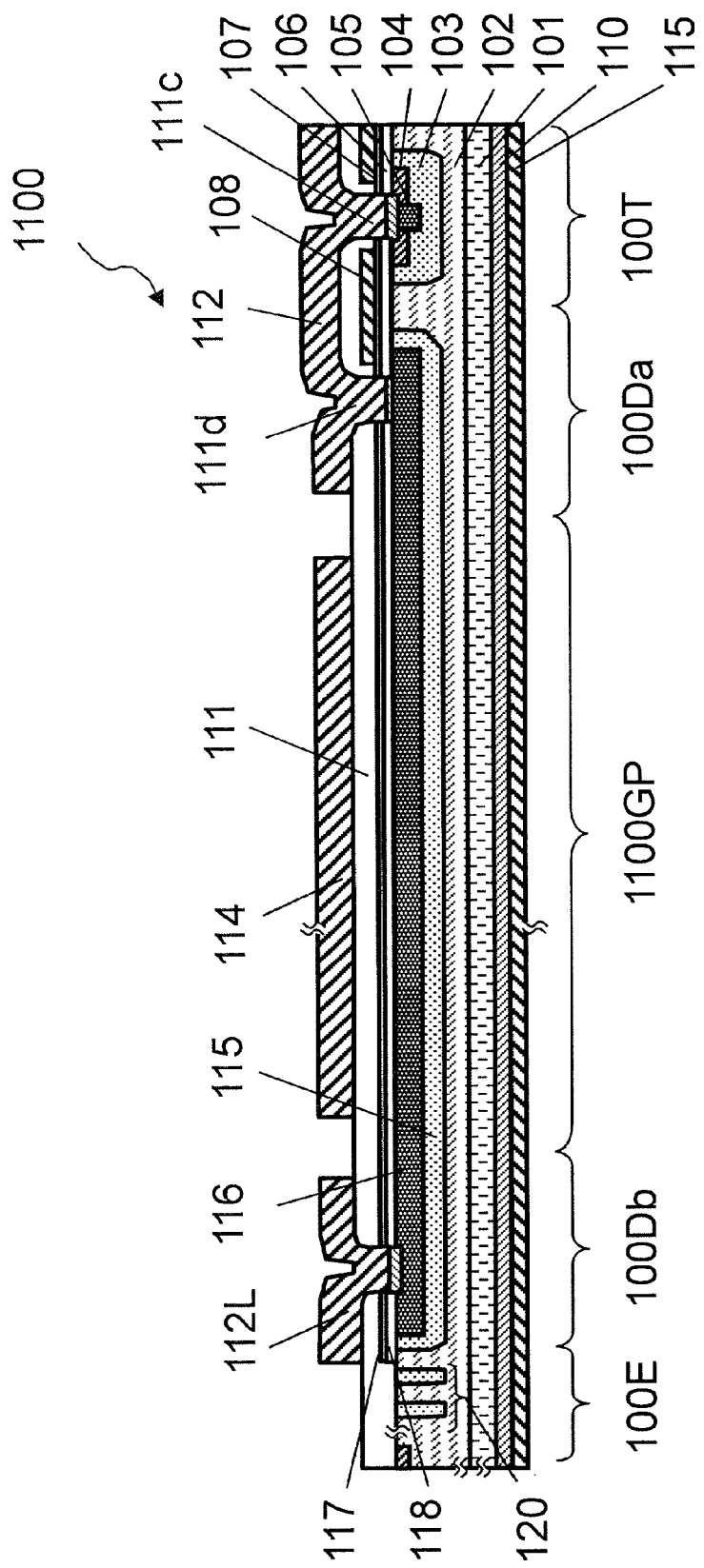
FIG. 12 is a schematic sectional diagram illustrating one example of an SiC-MOSFET according to a third modification.

FIG. 12 illustrates a sectional schematic diagram illustrating the cross-section along line II-II in FIGS. 1A and 1B (gate pad region) according to the third modification. The structure of gate line region 100GL (cross-section along line I-I in FIGS. 1A and 1B) in the third modification is the same as that illustrated in FIG. 2. SiC-MOSFET 1100 according to the third modification of the present exemplary embodiment includes transistor region 100T, termination region 100E, gate pad region 1100GP, diode region 100Da, and diode region 100Db on the cross-section along line II-II in FIGS. 1A and 1B. Gate pad region 1100GP is disposed to be sandwiched between diode region 100Da and transistor region 100T. Further, diode region 100Db is disposed to be adjacent to termination region 100E. The structures of transistor region 100T, diode regions 100Da, 100Db, and termination region 100E are the same as those illustrated in FIG. 3. Gate pad region 1100GP includes drift layer 102 formed on the main surface of SiC semiconductor substrate 101, epitaxial layer 118 formed on drift layer 102, and insulating film 117, interlayer insulating film 111, and gate pad 114 which are formed on epitaxial layer 118. Drift layer 102 in gate pad region 1100GP has second well region 115 having a conductive type different from the conductive type of SiC semiconductor substrate 101 (here, second well region 115 is of p type). p+ type second contact region 116 containing p type impurities at a higher concentration than that in second well region 115 is formed in second well region 115. The p type impurity profile in the vertical direction is substantially the same between second well region 115 and first well region 103 and between second contact region 116 and first contact region 105. In addition, insulating film 117 is a thermally oxidized (SiO$_2$) film formed by thermally oxidizing the surface of epitaxial layer 118, and has a thickness substantially same as the thickness of gate insulating film 107. Considering that the MOSFET is switched to the off state from the on state, a displacement current flows into the well through the drain-source capacitance generated between the drift layer and the well region due to the rapid change in the drain-source voltage. Particularly, gate pad region 1100GP needs to be relatively wide for connection to the outside. Therefore, the second well region is much larger in comparison with the gate line portion, and extremely large displacement current flows therein through drain-source capacitance generated in this region. In the third modification, base electrodes are present on both sides of second well region 115. However, the second well region in gate pad region is extremely wide, and therefore, the path of the displacement current is inevitably long. Thus, a considerable potential rise occurs in second well region 115 below the gate pad. It is configured such that interlayer insulating film 111 is thoroughly formed on insulating film 117 in the gate pad as in the third modification. With this configuration, even if a considerable potential rise occurs in second well region 115 below the gate pad, a voltage is distributed to the portion above insulating film 117 and interlayer insulating film 111, whereby an electric field applied to insulating film 117 can be relaxed. Consequently, breakdown of insulating film 117 below the gate pad can be prevented.

SiC-MOSFET 1100 according to the third modification can be manufactured by the similar manufacturing method only by changing a mask layout of SiC-MOSFET 100 according to the exemplary embodiment described above.

Fourth Modification

Figure 13:
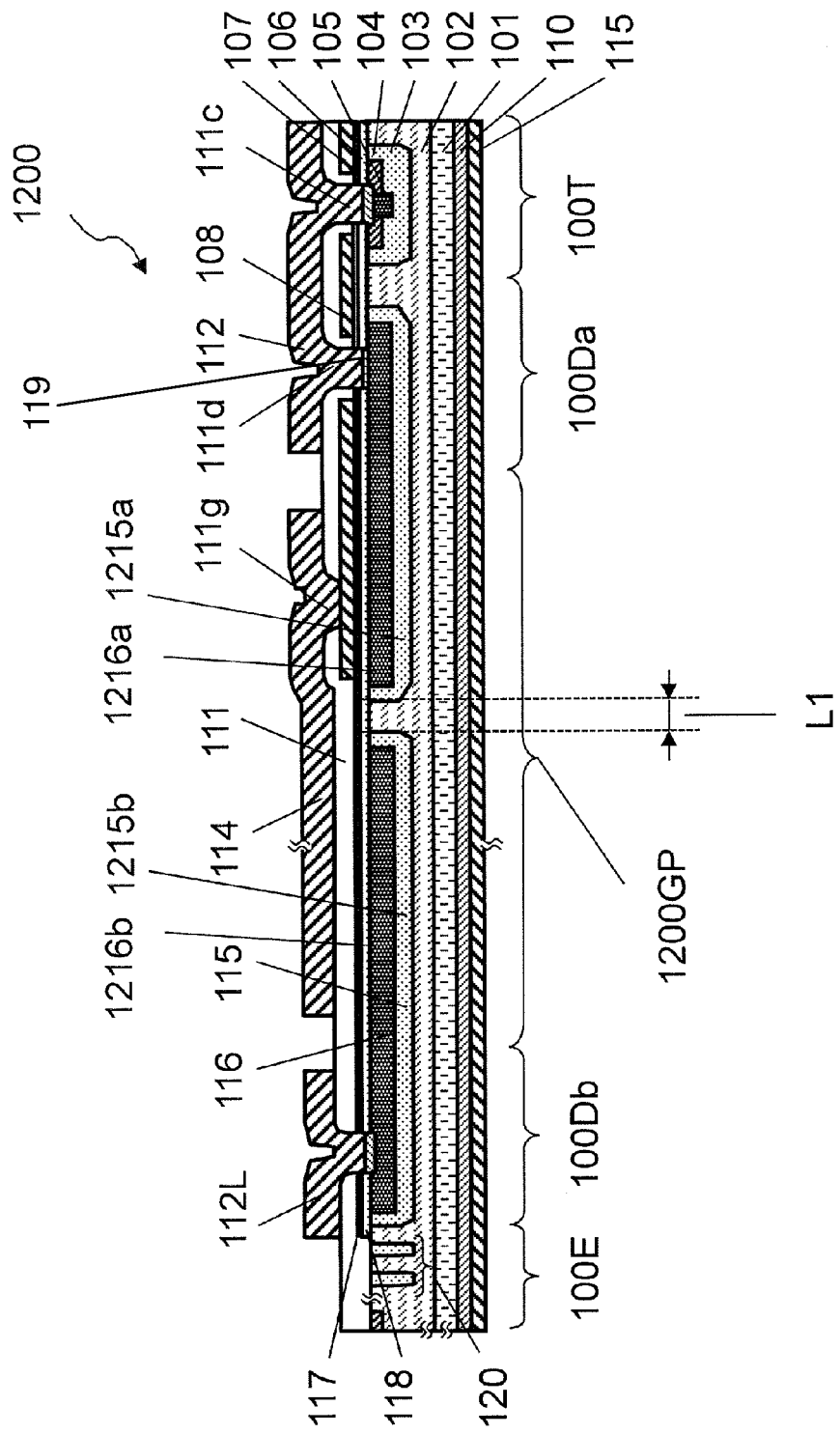
FIG. 13 is a schematic sectional diagram illustrating one example of an SiC-MOSFET according to a fourth modification.

A fourth modification of the semiconductor device according to the present exemplary embodiment will be described with reference to FIG. 13. In gate pad region 100GP for external connection, second well region 115 is wide in comparison with gate line region 100GL. A displacement current flows according to the area of second well region 115. Therefore, when a thin insulating film is present alone on second well region 115, it is preferable that second well region 115 is narrow. SiC-MOSFET 1200 according to the present fourth modification is characterized in that second well region 1215 of gate pad region 1200GP is divided in gate pad region 1200GP. With this structure, the area of the second well region where only a thin insulating film is present can be decreased, whereby breakdown of insulating film 117 in gate pad region 1200GP can be prevented.

In SiC-MOSFET 1200 according to the fourth modification, the structure of gate line region 100GL (cross-section along line I-I in FIGS. 1A and 1B) is the same as that of SiC-MOSFET 100. SiC-MOSFET 1200 according to the fourth modification includes transistor region 100T, termination region 100E, gate pad region 1200GP, diode region 100Da, and diode region 100Db on the cross-section along line II-II in FIGS. 1A and 1B. Gate pad region 1200GP is disposed to be sandwiched between diode regions 100Da, 100Db. Diode region 100Db is disposed to be adjacent to termination region 100E. The structures of transistor region 100T, diode regions 100Da, 100Db, and termination region 100E are the same as those in the present exemplary embodiment.

Gate pad region 1200GP includes drift layer 102 formed on the main surface of SiC semiconductor substrate 101, epitaxial layer 118 formed on drift layer 102, and insulating film 117, interlayer insulating film 111, and gate pad 114 which are formed on epitaxial layer 118.

Drift layer 102 in gate pad region 1200GP has second well regions 1215*a* and 1215*b* having a conductive type different from the conductive type of SiC semiconductor substrate 101 (here, second well regions 1215*a* and 1215*b* are of p type). p+ type second contact regions 1216*a* and 1216*b* containing p type impurities at a higher concentration than that in second well regions 1215*a* and 1215*b* are formed in second well region 115.

Further, the impurity concentration profile in the vertical direction is substantially the same between second well regions 1215*a* and 1215*b* and first well region 103 and between second contact regions 1216*a* and 1216*b* and first contact region 105. In addition, insulating film 117 is a thermally oxidized ($SiO_2$) film formed by thermally oxidizing the surface of epitaxial layer 118, and is formed simultaneously with gate insulating film 107.

In this case, space L1 between second well region 1215*a* and second well region 1215*b* is equal to or less than space L2 (illustrated in FIG. 2) between first well regions 103 of transistor region 100T. Since space L1 between second well region 1215*a* and second well region 1215*b* is equal to or less than space L2 between first well regions 103, application of a voltage equal to that of the drain on the surface of drift layer 102 can be prevented due to the depletion layers, when a voltage is applied between the drain and source. Further, the distance from base electrode 119 on diode region 100Da to the farthest end of second well region 1215*a* is shorter than the distance from base electrode 119 on diode region 100Db to the farthest end of second well region 1215*b*. With the configuration in which the distance from base electrode 119 on diode region 100Da to the farthest end of second well region 1215*a* is decreased, the displacement current flowing through second well region 1215*b* can be suppressed.

Considering that the MOSFET is switched to the off state from the on state, a displacement current flows into the well through the drain-source capacitance generated between the drift layer and the well region due to the rapid change in the drain-source voltage. Particularly, gate pad region 1200GP needs to be relatively wide for connection to the outside. Therefore, second well regions 1215*a* and 1215*b* are much larger in comparison with the gate line portion, and extremely large displacement current flows therein through drain-source capacitance generated in this region. In the fourth modification, base electrodes are present at both sides of second well regions 1215*a* and 1215*b*, and each of second well regions 1215*a* and 1215*b* is electrically connected to corresponding one of the base electrodes. A displacement current can be suppressed with the configuration as in the present fourth modification in which the second well region is divided in the gate pad, and the distance to the base electrode from the end of second well region 1215*a* on which the gate electrode is present is decreased. Further, a potential rise can be suppressed by decreasing the distance of a path through which the displacement current flows. Consequently, breakdown of insulating film 117 below the gate pad can be prevented.

SiC-MOSFET 1200 according to the fourth modification can be manufactured by the similar manufacturing method only by changing a mask layout of SiC-MOSFET 100 according to the exemplary embodiment described above.

Fifth Modification

A fifth modification of the semiconductor device according to the present exemplary embodiment will be described with reference to FIGS. 14A, 14B, 15A, and 15B.

A displacement current or an avalanche current always flows out to upper source line 112L and upper electrode 112 through base electrode 119. Therefore, it is desirable to reduce a potential rise on base electrode 119 due to contact resistance simultaneously with the reduction in a potential rise in the second well region. SiC-MOSFETs 1300 and 1400 according to the fifth modification are characterized in that the contact area of base electrode 119 located near the corner of second well region 115, in particular, out of base electrodes 119 on the diode region formed between gate line 112 and transistor region 100T is large. With this structure, the potential rise due to contact resistance on the base region where current is particularly concentrated can be reduced. Consequently, breakdown of the insulating film on the second well can be prevented.

Figure 14A:
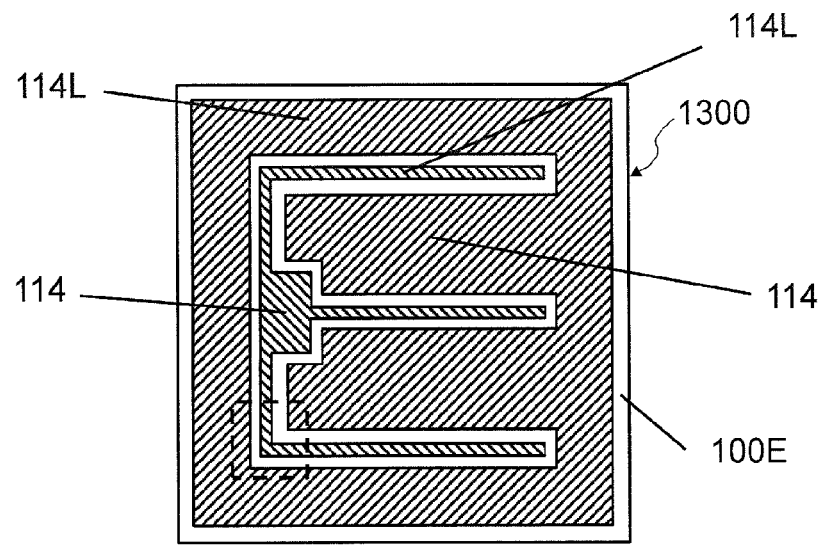
FIG. 14A is a plan view illustrating one example of an SiC-MOSFET according to a fifth modification.
Figure 14B:
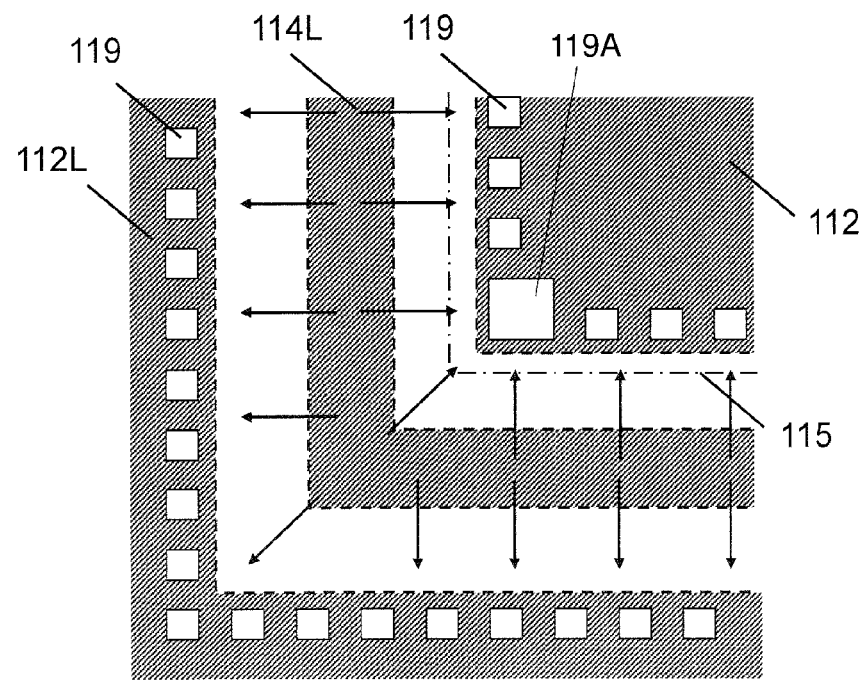
FIG. 14B is a plan view illustrating one example of the SiC-MOSFET according to the fifth modification.
Figure 15A:
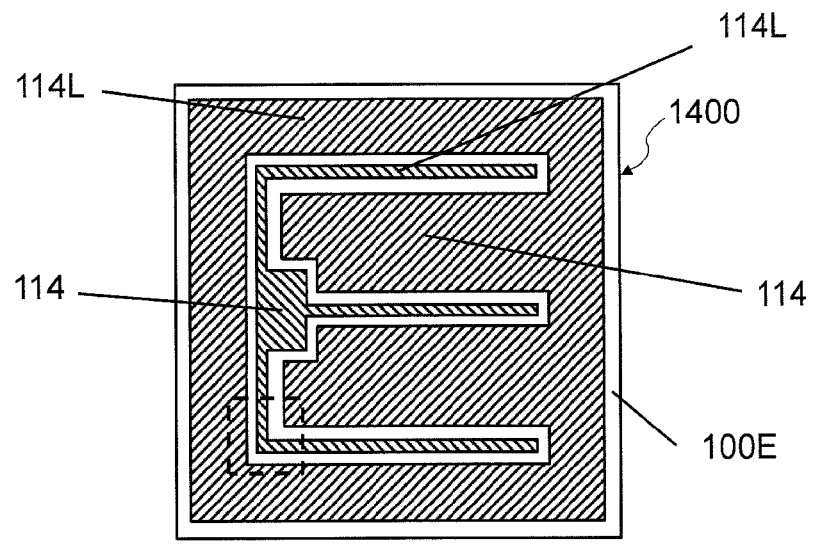
FIG. 15A is a plan view illustrating one example of the SiC-MOSFET according to the fifth modification.
Figure 15B:
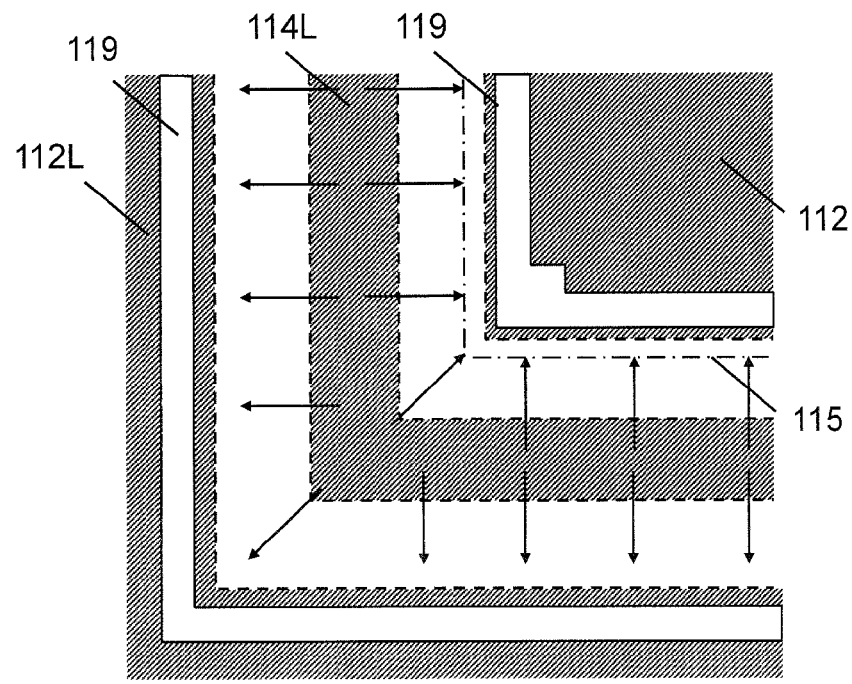
FIG. 15B is a plan view illustrating one example of the SiC-MOSFET according to the fifth modification.

FIGS. 14A to 15B illustrate plan views in the fifth modification. FIGS. 14A and 15A are plan views of the entire semiconductor device, and FIGS. 14B and 15B illustrate enlarged views of portions enclosed by a broken line.

For example, in the case where base electrode 119 has a rectangular shape as viewed in the direction perpendicular to the main surface of SiC-MOSFET semiconductor substrate 101 as illustrated in FIG. 14B, the area of base electrode 119A located at the shortest distance from the corner of second well region 115 is larger than the area of base electrode 119 adjacent to base electrode 119A. Further, in the case where base electrode 119 has a stripe shape as viewed in the direction perpendicular to the main surface of SiC-MOSFET semiconductor substrate 101 as illustrated in FIG. 15B, the width of the stripe is maximized at the corner of second well region 115. With this structure, the potential rise on base electrode 119 can be suppressed, and further, this structure can prevent base electrode 119 from being broken when a current more than the maximum allowable current flows therein.

Further, arrows in FIGS. 14B and 15B schematically show the flow of a displacement current in a plan view. Considering that the MOSFET is switched to the off state from the on state, a displacement current flows into the well through the drain-source capacitance generated between the drift layer and the well region due to the rapid change in the drain-source voltage. In a plan view, the displacement current doesn't flow into base electrode 119, which is not located at the corner of second well region 115, in only one direction. On the other hand, the current flows into base electrode 119A near the corner of second well region 115 in two directions (from left to right and from bottom to top in the figures). When the area of base electrode 119A is larger than the area of adjacent base electrode 119, a potential rise on base electrode 119A can be suppressed even if a high displacement current flows therein. Second well region 115 and base electrode 119 are disposed in series with respect to the path of the displacement current. Therefore, the potential rise on any position of second well region 115 is a total of the potential rise due to the resistance of second well region 115 and the potential rise on the base electrode due to the contact resistance. Accordingly, the suppression of the potential rise on base electrode 119 leads to the suppression of the potential rise in second well region 115, whereby breakdown of the insulating film on second well region 115 can be prevented. Further, since the amount of allowable current of base electrode 119 also increases in proportion to an area, breaking of the base electrode can be prevented.

Further, as illustrated in FIG. 15B, the similar effect can be obtained even when the base electrode has a stripe shape.

Although the modifications describe the base electrode sandwiched between the gate line and the transistor cell, it is obvious that the similar effect can be obtained with the base electrode formed between the gate line and the termination portion, between the gate pad and the transistor cell, and between the gate pad and the transistor cell.

The SiC-MOSFET according to the present disclosure is widely applicable to semiconductor devices for various uses, and various control devices or drive devices provided with the semiconductor devices, such as inverter circuits.

What is claimed is:

1. A silicon carbide semiconductor device comprising, a laminated structure that includes a first conductive type semiconductor substrate, a first conductive type first silicon carbide semiconductor layer located on a main surface of the semiconductor substrate, and a first ohmic electrode located on a back surface of the semiconductor substrate, the laminated structure including a transistor region, a termination region, and a diode region, each region including a part of the semiconductor substrate, a part of the first silicon carbide semiconductor layer, and a part of the first ohmic electrode, wherein the termination region surrounds the transistor region and the diode region is located between the transistor region and the termination region when viewed in a direction perpendicular to the main surface of the semiconductor substrate, wherein the transistor region includes a plurality of unit cell regions, the silicon carbide semiconductor device comprises:

in each of the unit cell regions, a second conductive type first well region located in a part of the first silicon carbide semiconductor layer;

a first conductive type source region located in the first well region;

a second silicon carbide semiconductor layer formed on a part of the first silicon carbide semiconductor layer so as to be in contact with at least a part of the first well region and a part of the source region, the second silicon carbide semiconductor layer including a first conductive type layer having a lower impurity concentration than an impurity concentration of at least the first silicon carbide semiconductor layer;

a gate insulating film on the second silicon carbide semiconductor layer;

a gate electrode located on the gate insulating film;

a second ohmic electrode electrically connected to the source region; and an upper electrode electrically connected to the second ohmic electrode, the silicon carbide semiconductor device comprises, in the diode region:

a second conductive type second well region located in a part of the first silicon carbide semiconductor layer;

a contact region located in the second well region and having a higher impurity concentration than an impurity concentration of the second well region;

a second silicon carbide semiconductor layer formed on a part of the first silicon carbide semiconductor layer so as to be in contact with at least a part of the contact region;

an insulating film formed on the second silicon carbide semiconductor layer and having a thickness substantially same as a thickness of the gate insulating film;

a gate electrode formed on at least a part of the insulating film;

a gate line located on the contact region and electrically connected to the gate electrode;

a gate pad located on the contact region and electrically connected to the gate line for establishing external connection;

an inner third ohmic electrode electrically connected to at least a region located between the gate line and the transistor region in the contact region, and an outer third ohmic electrode electrically connected to at least a region located between the gate line and the termination region in the contact region; and a source line electrically connected to the inner third ohmic electrode and the upper electrode on each of the unit cell regions, and the silicon carbide semiconductor device comprises, in the termination region, a second conductive type impurity region located in a part of the first silicon carbide semiconductor layer, wherein the gate electrode is located between the inner third ohmic electrode and the outer third ohmic electrode when viewed in a direction perpendicular to the main surface of the semiconductor substrate.

2. The silicon carbide semiconductor device according to claim 1, further comprising, between the gate line in the diode region and the termination region, at least one unit cell having a structure same as a structure of each of the unit cell regions in the transistor region.

3. The silicon carbide semiconductor device according to claim 1 or 2, wherein the laminated structure has a shape of a substantially rectangle as viewed in the direction, and a breakdown voltage of the termination region on two corners closer to the gate pad out of four corners of the rectangle is higher than a breakdown voltage of the termination region on at least one of the other two corners.

4. The silicon carbide semiconductor device according to claim 3,
wherein the impurity region constitutes a field limiting ring (FLR) in the termination region, and
a radius of the impurity region on the two corners closer to the gate pad is larger than a radius of the impurity region on at least one of the other two corners.

5. The silicon carbide semiconductor device according to claim 3,
wherein the impurity region constitutes a field limiting ring (FLR) structure in the termination region, and
a width of the impurity region on the two corners closer to the gate pad is larger than a width of the impurity region on at least one of the other two corners.

6. The silicon carbide semiconductor device according to claim 1, comprising a plurality of the third ohmic electrodes between the gate line in the diode region and the transistor region,
wherein the plurality of the third ohmic electrodes has a rectangular or a circular shape as viewed in the direction, and
a third ohmic electrode closest to a corner of the second well region, out of the plurality of the third ohmic electrodes, has an area larger than an area of a third ohmic electrode adjacent to the third ohmic electrode closest to the corner of the second well region.

7. The silicon carbide semiconductor device according to claim 1, comprising a plurality of the third ohmic electrodes between the gate line in the diode region and the transistor region,
wherein the plurality of the third ohmic electrodes has a stripe shape as viewed in the direction, and
a width of the stripe is maximized at a corner of the second well region.

8. The silicon carbide semiconductor device according to claim 1, wherein
the second well region is divided into multiple regions in the diode region, and
a space between the divided multiple second well regions is equal to or less than a space between the divided multiple second well regions and the first well region.

* * * * *